(12) United States Patent
Moon et al.

(10) Patent No.: US 11,450,788 B2
(45) Date of Patent: Sep. 20, 2022

(54) SEMICONDUCTOR DEVICE

(71) Applicant: LG INNOTEK CO., LTD., Seoul (KR)

(72) Inventors: Yong Tae Moon, Seoul (KR); Ji Hyung Moon, Seoul (KR); Sang Youl Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 148 days.

(21) Appl. No.: 16/978,074

(22) PCT Filed: Mar. 22, 2019

(86) PCT No.: PCT/KR2019/003346
§ 371 (c)(1),
(2) Date: Sep. 3, 2020

(87) PCT Pub. No.: WO2019/182394
PCT Pub. Date: Sep. 26, 2019

(65) Prior Publication Data
US 2021/0020807 A1    Jan. 21, 2021

(30) Foreign Application Priority Data
Mar. 22, 2018   (KR) .......................... 10-2018-0033356

(51) Int. Cl.
*H01L 33/30* (2010.01)
*H01L 33/38* (2010.01)
(Continued)

(52) U.S. Cl.
CPC ............ *H01L 33/382* (2013.01); *H01L 33/06* (2013.01); *H01L 33/20* (2013.01); *H01L 33/30* (2013.01); *H01L 33/32* (2013.01); *H01L 33/36* (2013.01)

(58) Field of Classification Search
CPC ......... H01L 33/36; H01L 33/20; H01L 33/32; H01L 33/44; H01L 33/06; H01L 33/08
See application file for complete search history.

(56) References Cited

U.S. PATENT DOCUMENTS

2007/0102715 A1\* 5/2007 Ko .......................... H01L 33/20
257/88
2007/0170415 A1  7/2007 Maruta
(Continued)

FOREIGN PATENT DOCUMENTS

JP    2005-197473 A    7/2005
JP    2008-193006 A    8/2008
(Continued)

*Primary Examiner* — Savitri Mulpuri
(74) *Attorney, Agent, or Firm* — Birch, Stewart, Kolasch & Birch, LLP

(57) ABSTRACT

In an embodiment, disclosed is a semiconductor device comprising: a semiconductor structure which comprises a first conductive semiconductor layer, a second conductive semiconductor layer, and an active layer disposed between the first conductive semiconductor layer and the second conductive semiconductor layer; a first electrode which is electrically connected to the first conductive semiconductor layer; and a second electrode which is electrically connected to the second conductive semiconductor layer, wherein an area ratio between an area of an upper surface of the second conductive semiconductor layer and an area of an outer surface of the active layer is 1:0.0005 to 1:0.01.

8 Claims, 15 Drawing Sheets

(51) Int. Cl.
*H01L 33/06* (2010.01)
*H01L 33/32* (2010.01)
*H01L 33/20* (2010.01)
*H01L 33/36* (2010.01)

(56) References Cited

U.S. PATENT DOCUMENTS

| | | | |
|---|---|---|---|
| 2012/0132946 | A1 | 5/2012 | Park |
| 2018/0090539 | A1* | 3/2018 | Son .................. H01L 33/06 |
| 2019/0013439 | A1* | 1/2019 | Sung ................ H01L 33/58 |
| 2021/0036187 | A1* | 2/2021 | Lee ................. H01L 25/0753 |

FOREIGN PATENT DOCUMENTS

| | | |
|---|---|---|
| KR | 10-2013-0039574 A | 4/2013 |
| KR | 10-2014-0036717 A | 3/2014 |
| KR | 10-2014-0142849 A | 12/2014 |
| WO | WO 2012/170994 A2 | 12/2012 |

\* cited by examiner

[Fig.1a]
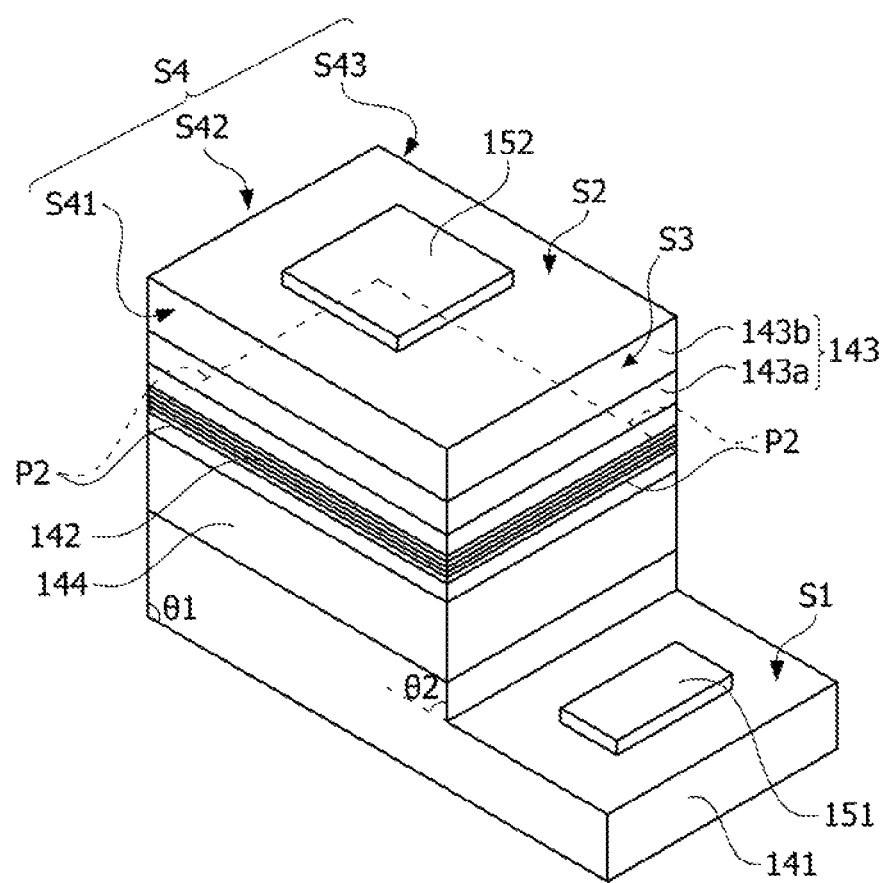

[Fig.1b]
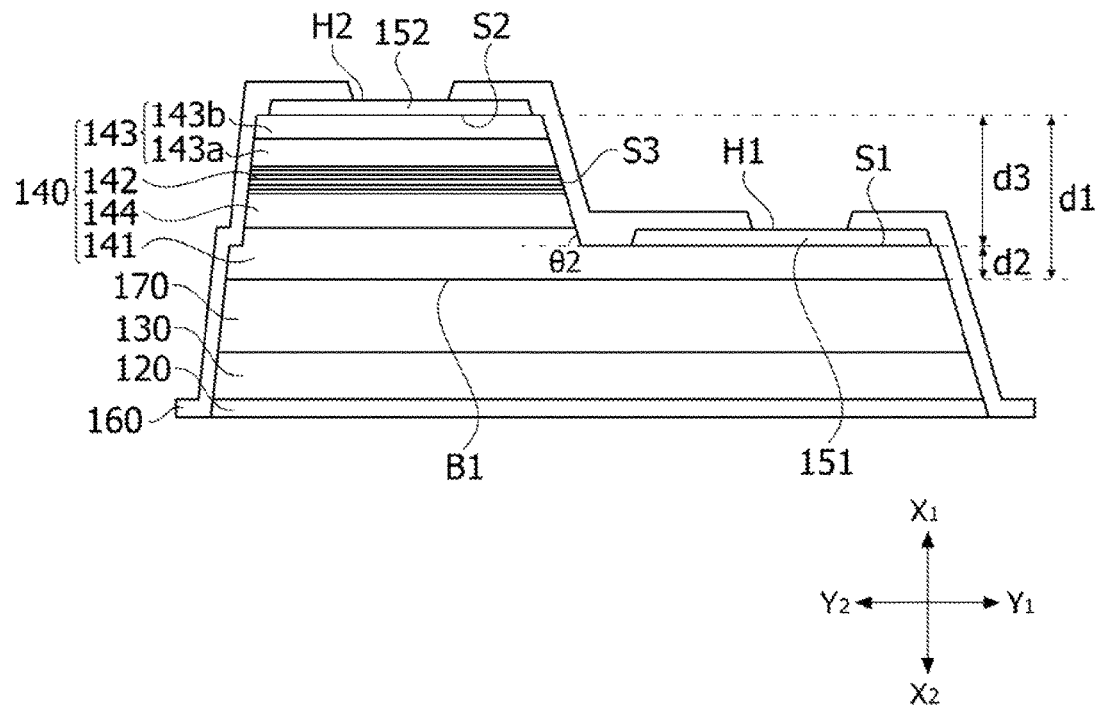
[Fig.2]
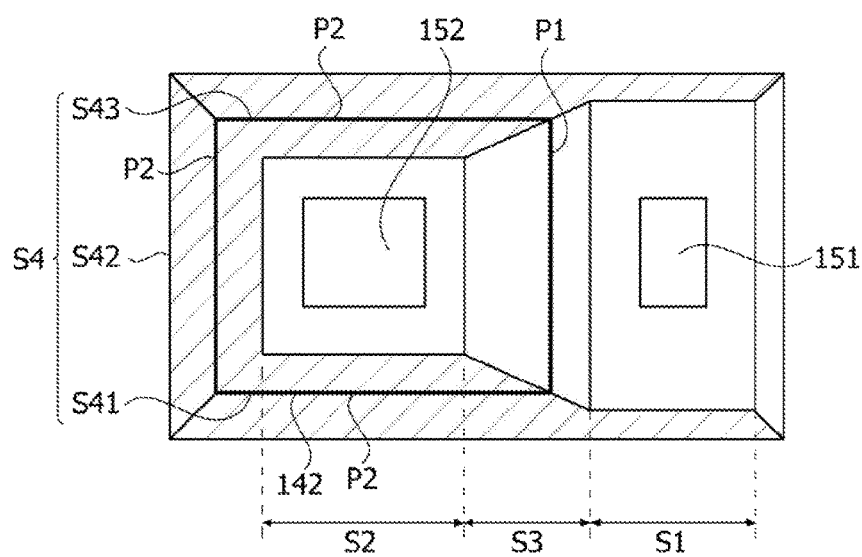

【Fig.3】
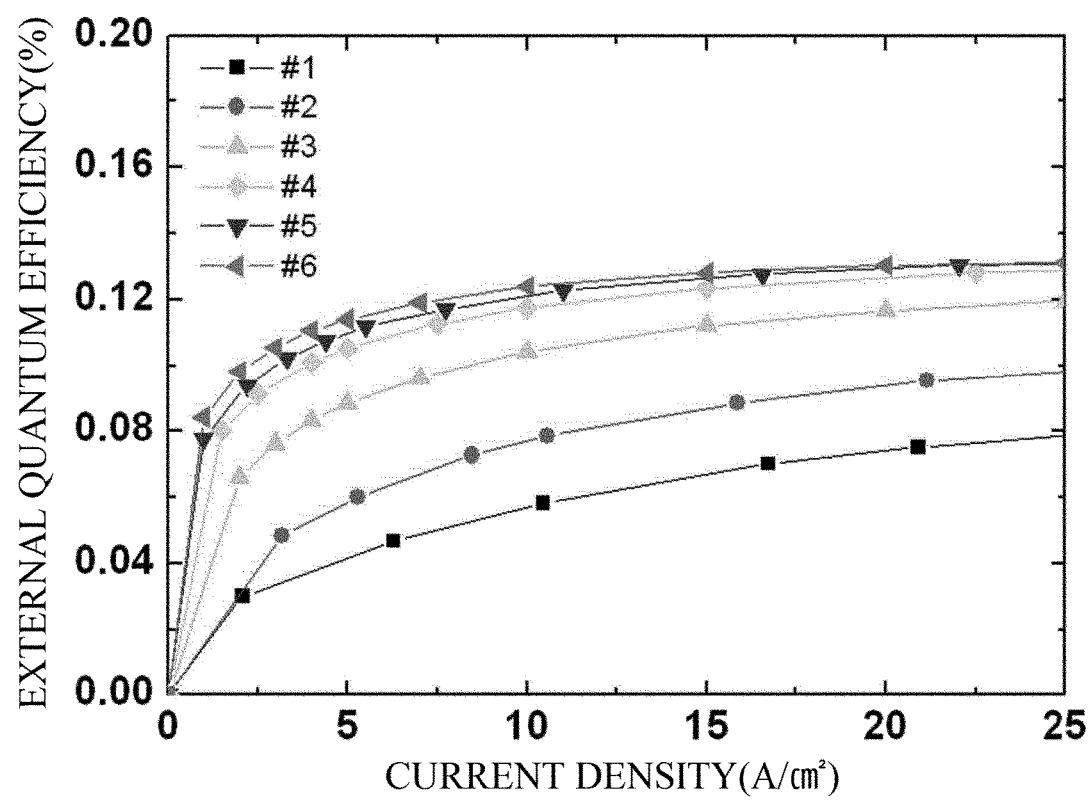

[Fig.4]
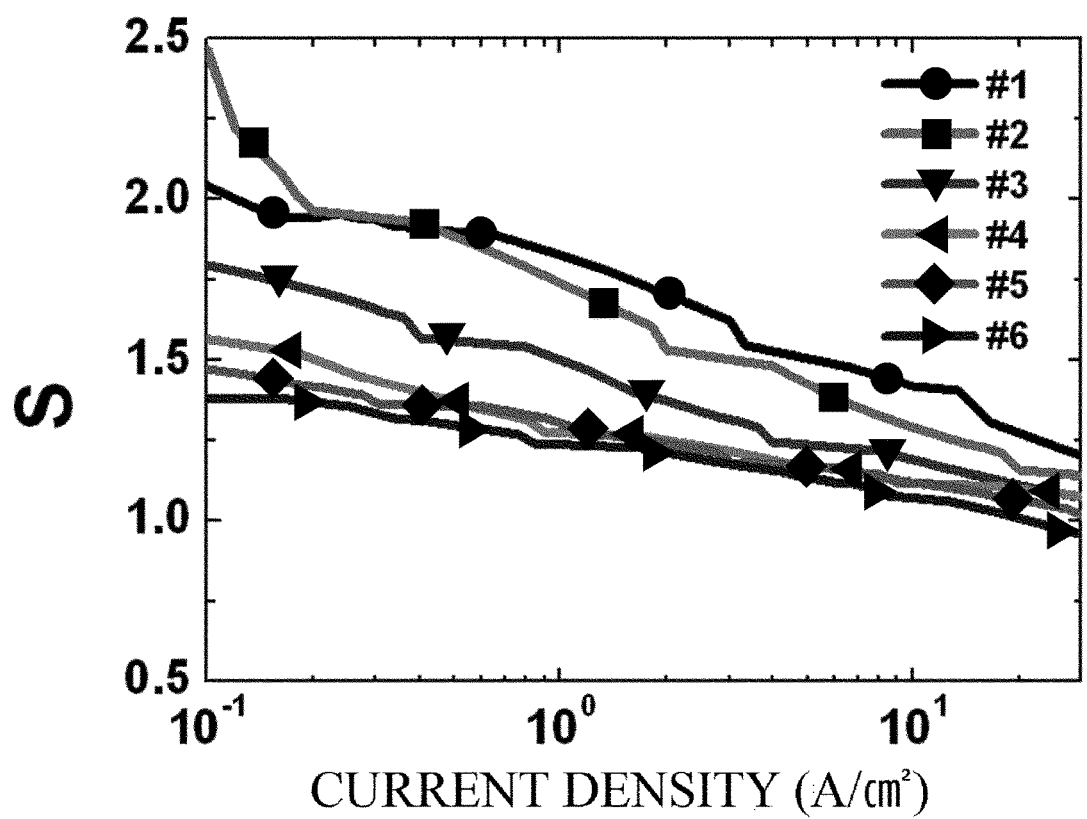

【Fig.5】
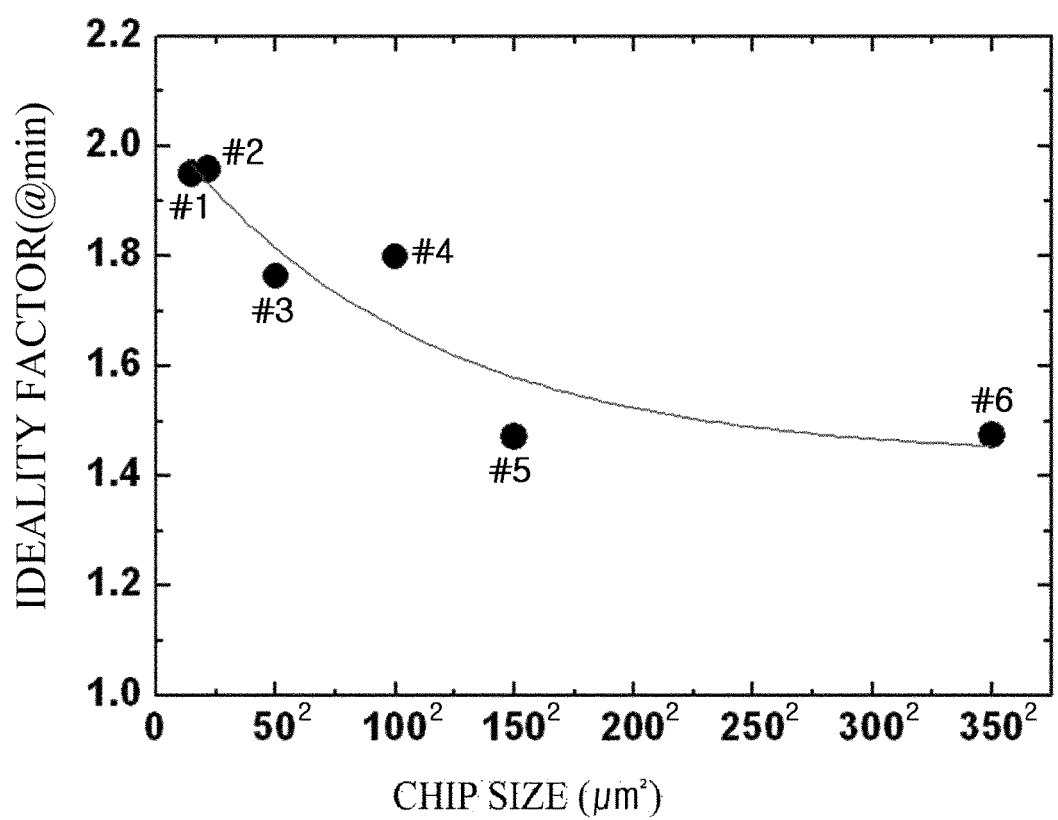

[Fig.6]
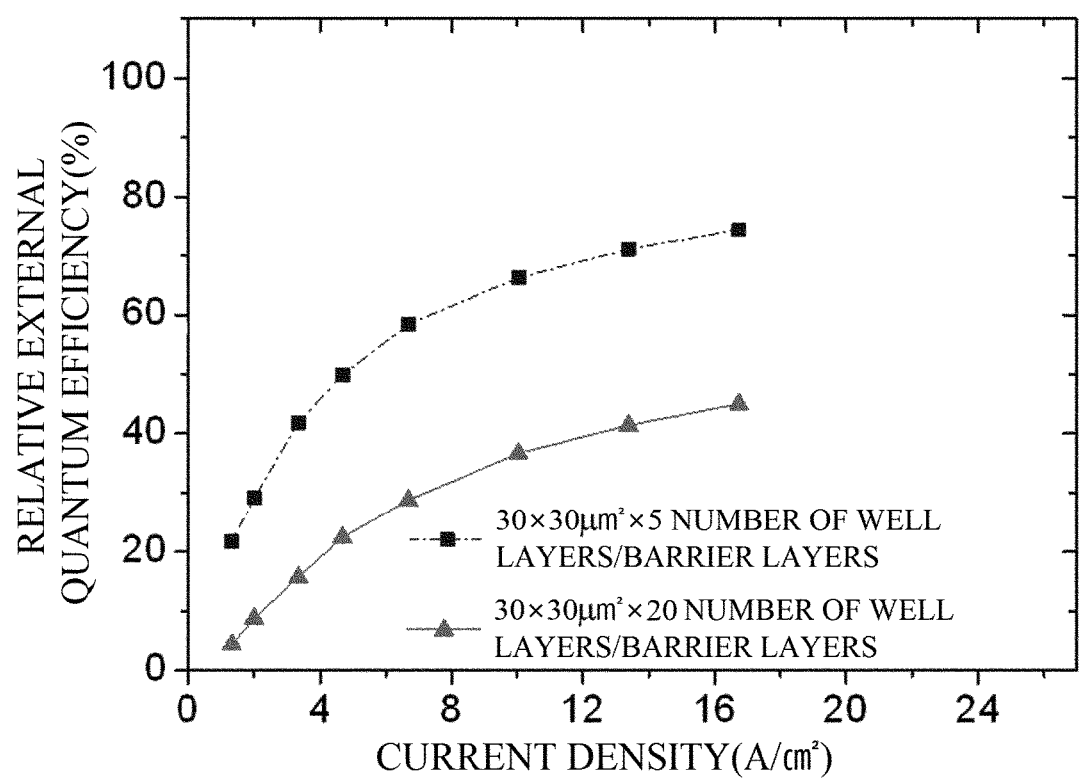

[Fig.7]
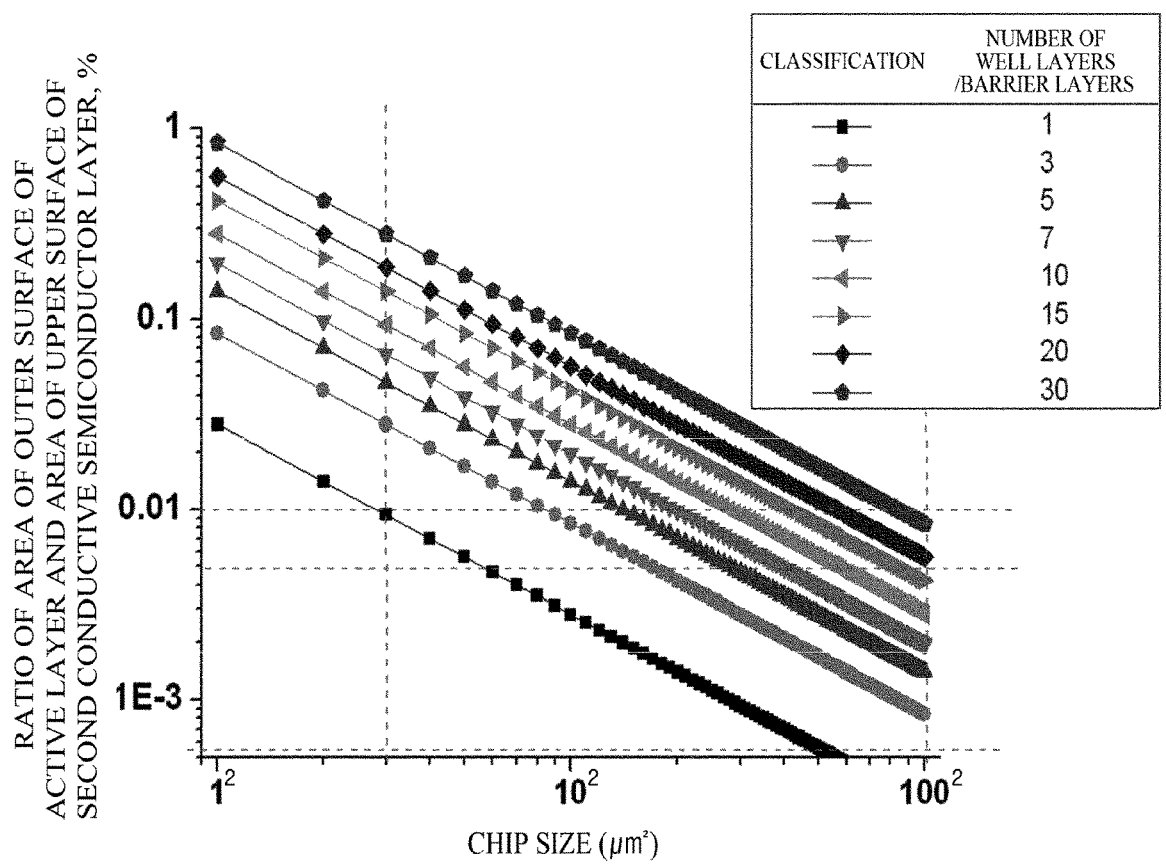

[Fig.8]
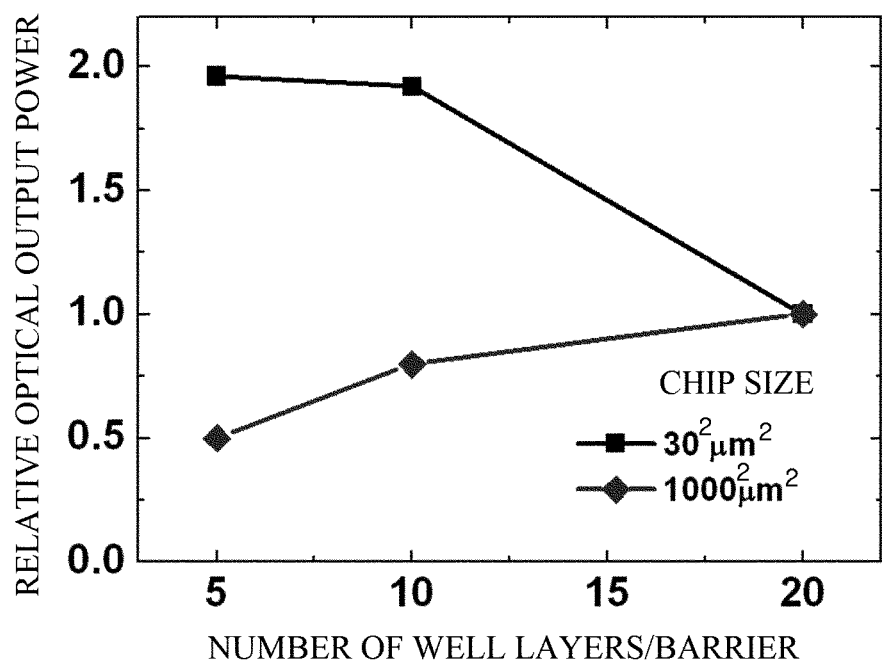

[Fig.9]
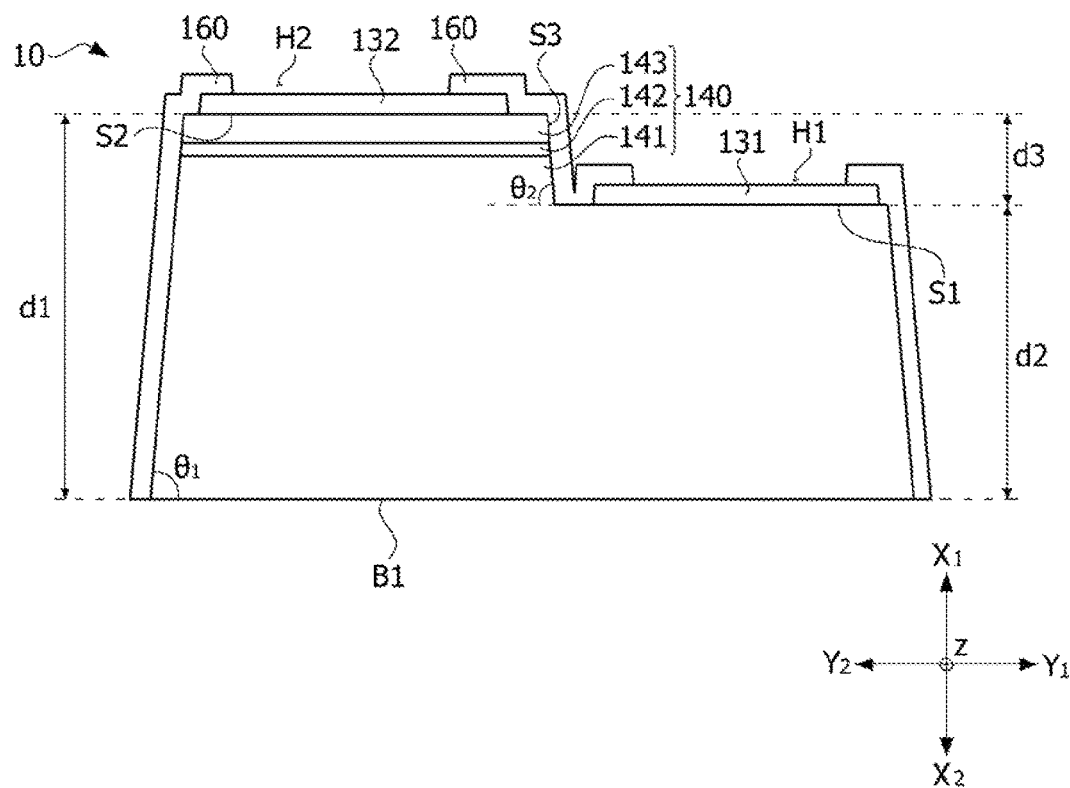
[Fig.10a]
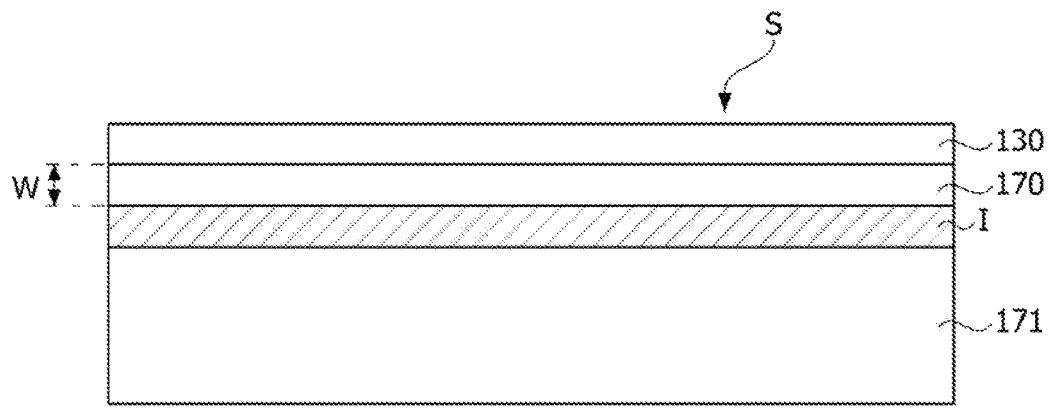

[Fig.10b]
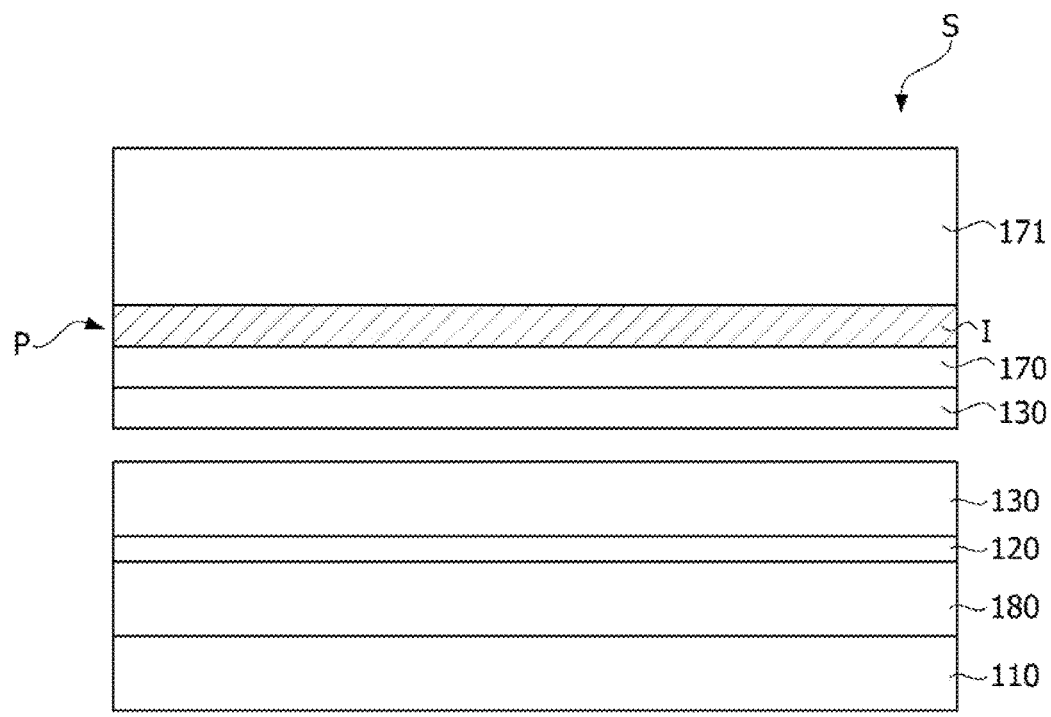
[Fig.10c]
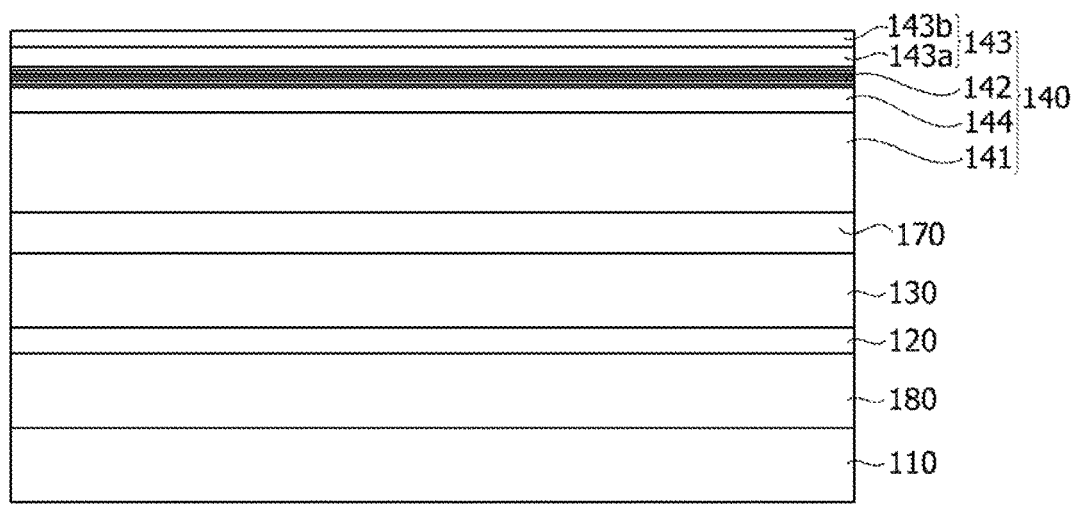

【Fig.10d】
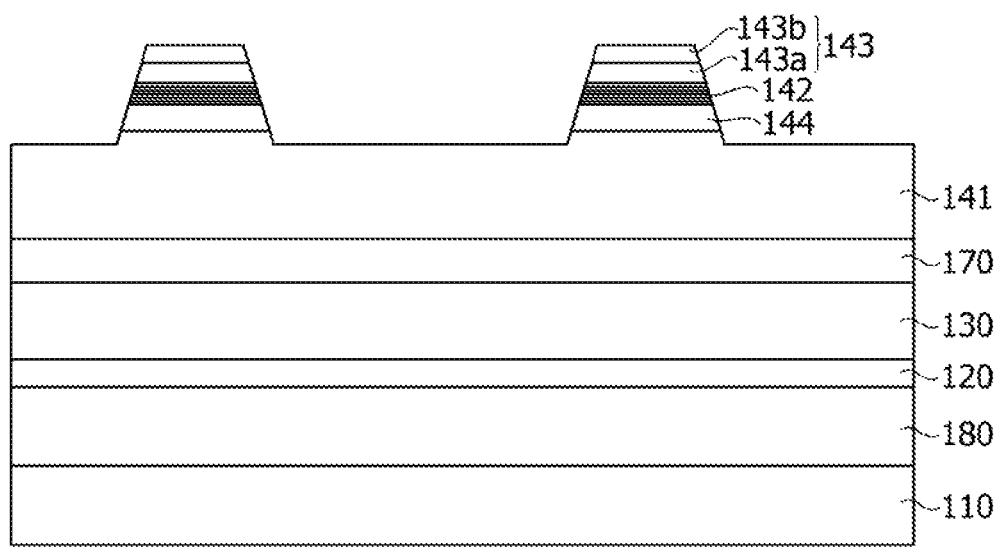
【Fig.10e】
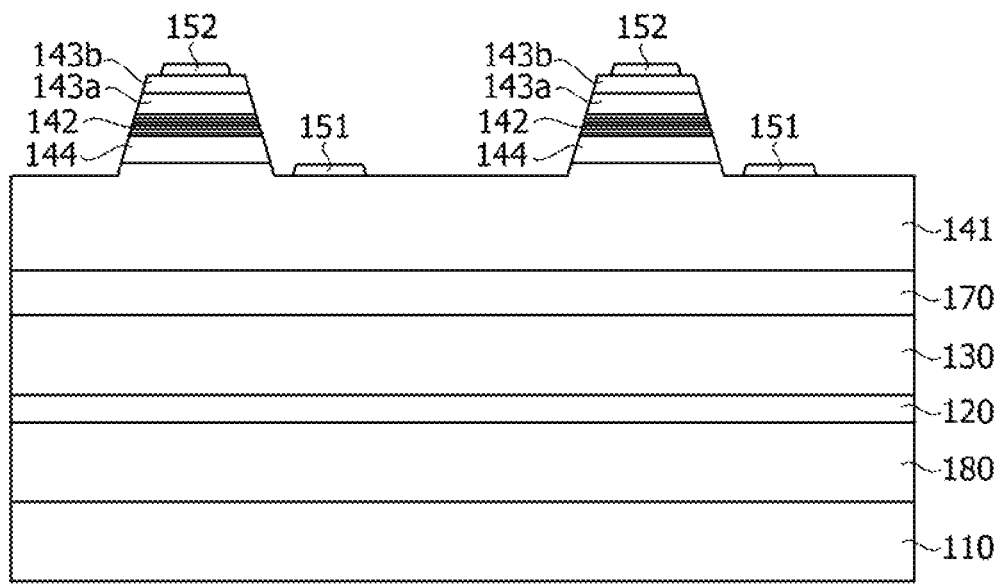

[Fig.10f]
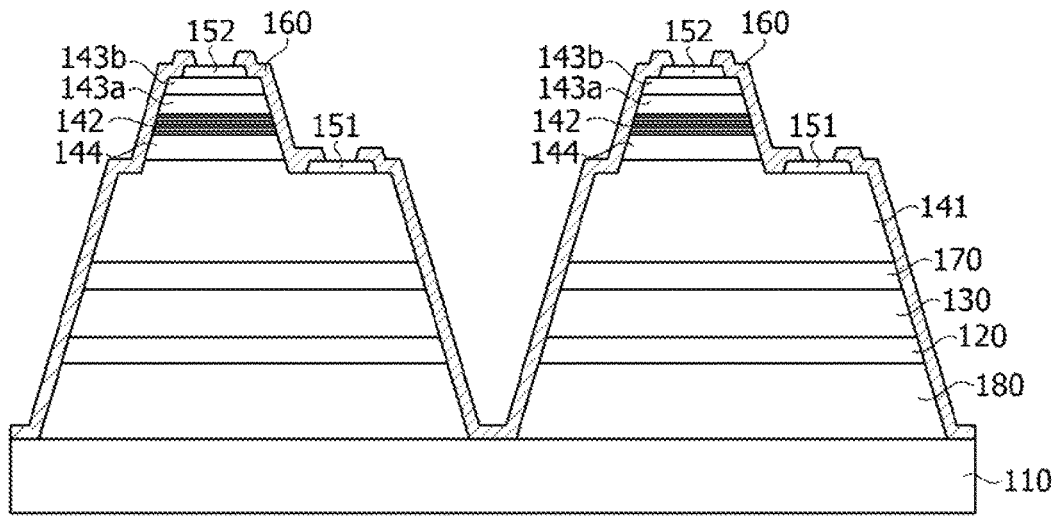
[Fig.11a]
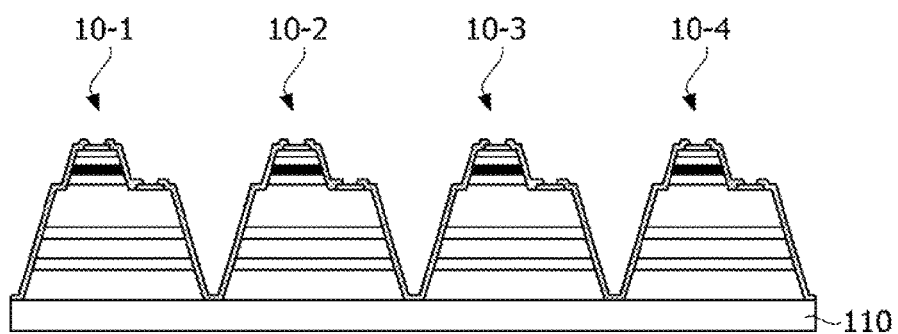

[Fig.11b]
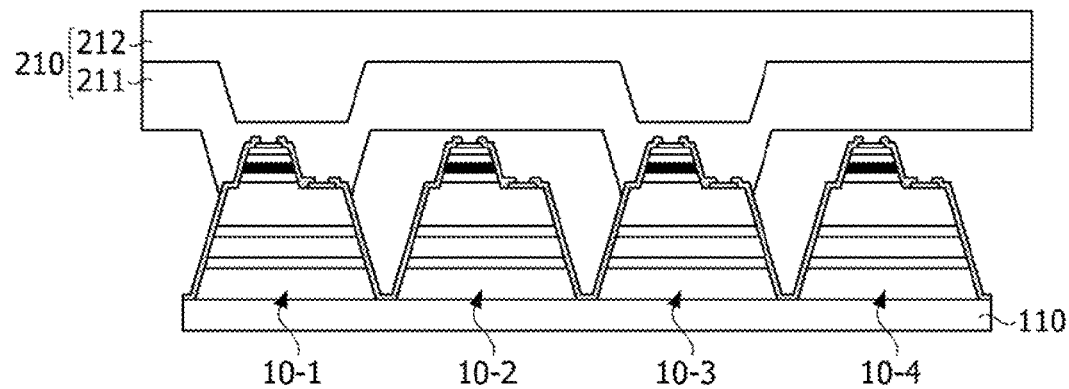
[Fig.11c]
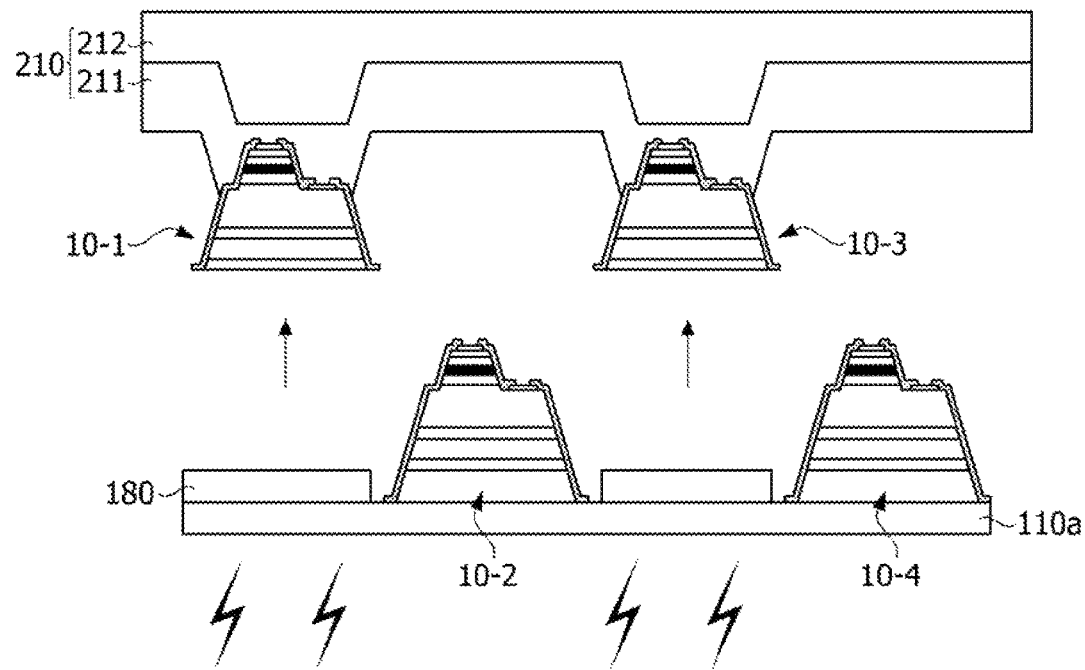

【Fig.11d】
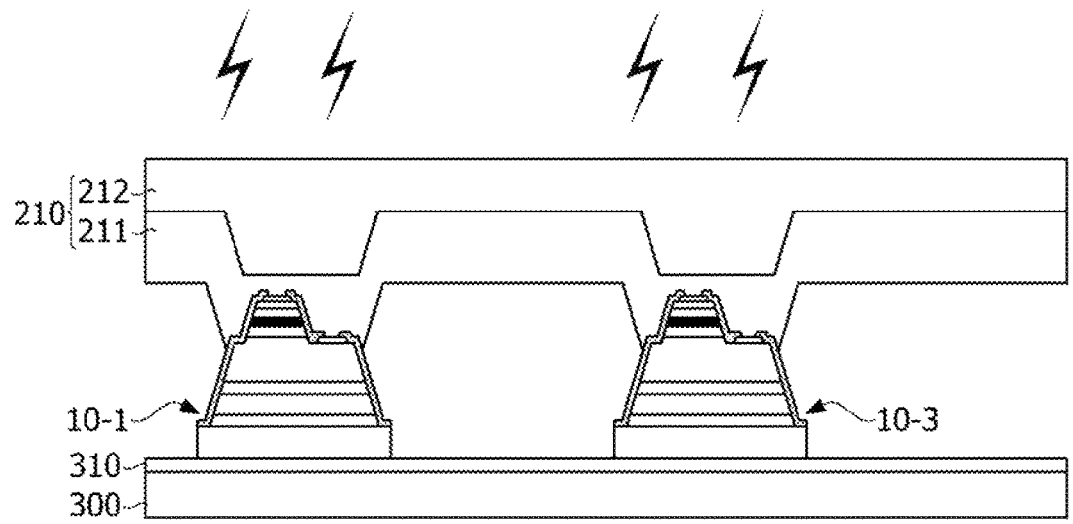
【Fig.11e】
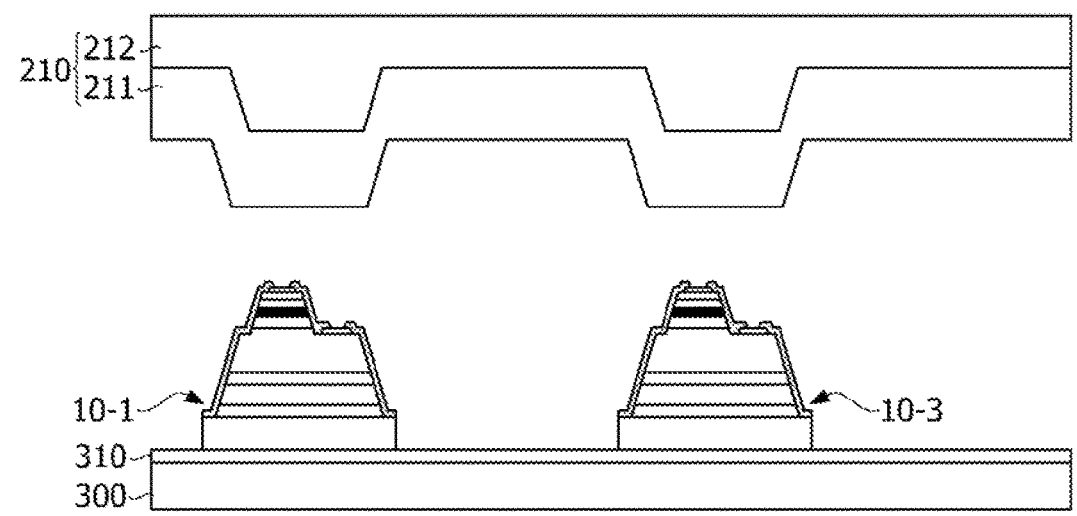

[Fig.12]
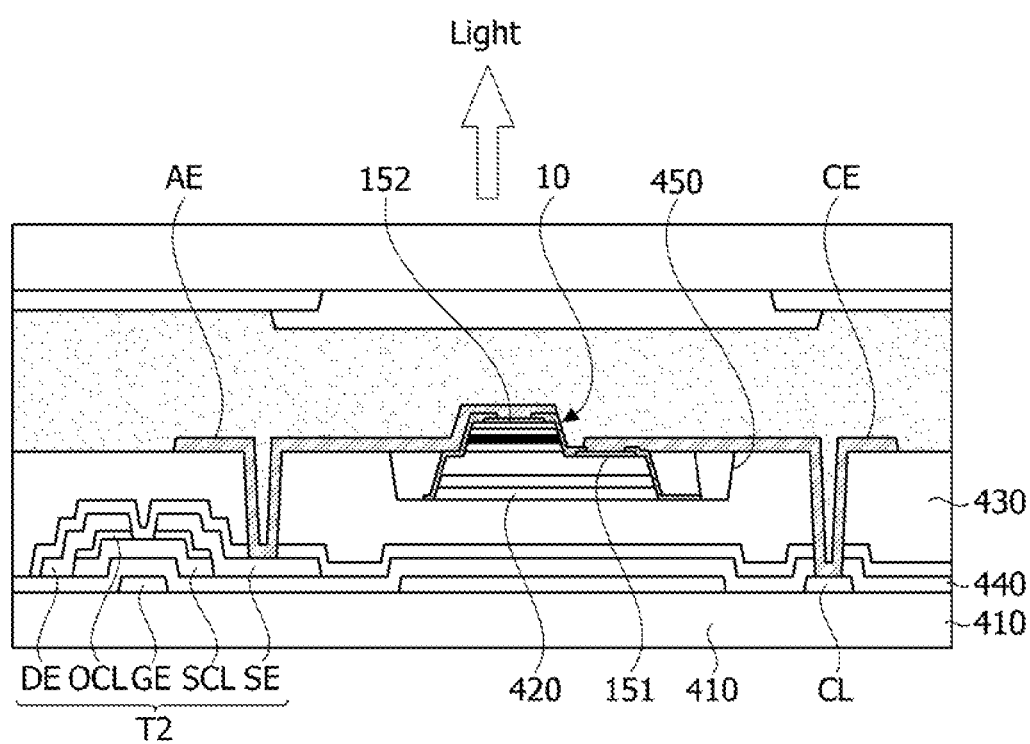

SEMICONDUCTOR DEVICE

CROSS REFERENCE TO RELATED APPLICATIONS

This application is the National Phase of PCT International Application No. PCT/KR2019/003346, filed on Mar. 22, 2019, which claims priority under 35 U.S.C. 119(a) to Patent Application No. 10-2018-0033356, filed in the Republic of Korea on Mar. 22, 2018, all of which are hereby expressly incorporated by reference into the present application.

TECHNICAL FIELD

Embodiments relate to a semiconductor device.

BACKGROUND ART

A light-emitting diode (LED) is one of light-emitting devices that emit light when current is applied. The LED may emit high-efficiency light at a low voltage and thus has an excellent energy saving effect. Recently, since the luminance problem of the LED has been significantly improved, LEDs are being applied to various devices such as backlight units of liquid crystal display devices, electric signboards, indicators, and home appliances.

Further, studies for reducing the size of a light-emitting device are actively being conducted in various fields. For example, in a display field, resolution may be improved as the size of the light-emitting device decreases.

However, there is a problem in that reduced optical output power is provided when current density decreases as the size of the light-emitting device decreases.

DISCLOSURE

Technical Problem

An embodiment is directed to providing a semiconductor device.

An embodiment is also directed to providing a semiconductor device having luminous flux which is improved at low current density.

An embodiment is also directed to providing a semiconductor device with improved optical output power.

Problems to be solved in the embodiments are not limited to the above-described problems, and objects and effects which can be determined from the solutions and the embodiments of the problems described below are also included.

Technical Solution

A semiconductor device according to an embodiment includes a semiconductor structure including a first conductive semiconductor layer, a second conductive semiconductor layer, and an active layer disposed between the first conductive semiconductor layer and the second conductive semiconductor layer, a first electrode electrically connected to the first conductive semiconductor layer, and a second electrode electrically connected to the second conductive semiconductor layer, wherein a ratio of an area of an upper surface of the second conductive semiconductor layer and an area of outer side surfaces of the active layer is in a range of 1:0.0005 to 1:0.01.

The semiconductor structure may include a first upper surface on which the first electrode is disposed, a second upper surface on which the second electrode is disposed, and an inclined surface disposed between the first upper surface and the second upper surface, and the active layer may include a first-first outer side surface which is exposed at the inclined surface, and a first-second outer side surface other than the first-first outer side surface.

A ratio of a first minimum height from a bottom surface of the semiconductor structure to the second upper surface and a second minimum height from the bottom surface of the semiconductor structure to the first upper surface may be in a range of 1:0.6 to 1:0.95.

A difference between the first minimum height and the second minimum height may be less than 2 μm.

The active layer may include a well layer and a barrier layer which are alternately disposed, and the number of each of the well layer and the barrier layer may be from 1 to 10.

The semiconductor device may further include a coupling layer disposed below the semiconductor structure, and a sacrificial layer disposed below the coupling layer.

The semiconductor device may further include an intermediate layer disposed between the coupling layer and the semiconductor structure.

The intermediate layer may include GaAs.

A minimum distance between the first-first outer side surface and the second upper surface may be less than a minimum distance between the first-first outer side surface and the first upper surface.

The inclined surface may form a first angle with respect to a virtual horizontal plane, a side surface of the semiconductor structure may form a second angle with respect to the horizontal plane, and the first angle may be less than the second angle.

The first angle may be in a range of 60° to 80°, and the second angle may be in a range of 70° to 90°.

Advantageous Effects

According to embodiments, it is possible to implement a semiconductor device.

Further, it is possible to manufacture a semiconductor device having luminous flux which is improved at low current density.

Further, it is possible to manufacture a semiconductor device with improved optical output power.

Various advantages and effects of the present invention are not limited to the above description and can be more easily understood during the description of specific exemplary embodiments of the present invention.

DESCRIPTION OF DRAWINGS

FIG. 1A is a perspective view of a semiconductor device according to one embodiment.

FIG. 1B is a cross-sectional view of the semiconductor device according to one embodiment.

FIG. 2 is a plan view of the semiconductor device according to one embodiment.

FIG. 3 is a graph illustrating light efficiency with respect to current density for each area of a second upper surface shown in Table 1.

FIGS. 4 and 5 are graphs respectively illustrating an S value with respect to current density and an ideality factor for each area of the second upper surface shown in Table 1.

FIG. 6 is a graph illustrating external quantum efficiency (EQE) with respect to current density for the number of well layers/barrier layers.

FIG. 7 is a graph illustrating a ratio of an area of outer side surfaces of an active layer and the area of the second upper surface for the number of well layers/barrier layers.

FIG. 8 is a graph illustrating relative optical output power with respect to the number of well layers/barrier layers for the area of the second upper surface.

FIG. 9 is a cross-sectional view of a semiconductor device according to another embodiment.

FIGS. 10A to 10F are sequence diagrams illustrating a method of manufacturing a semiconductor device according to one embodiment.

FIGS. 11A to 11E are sequence diagrams illustrating a process of transferring the semiconductor device according to one embodiment to a display apparatus.

FIG. 12 is a conceptual diagram of a display apparatus to which the semiconductor device according to the embodiment is transferred.

MODES OF THE INVENTION

While the present invention is susceptible to various modifications and alternative forms, particular exemplary embodiments thereof are shown by way of example in the drawings and will herein be described in detail. It should be understood, however, that there is no intent to limit the present invention to the particular forms disclosed, but on the contrary, the present invention is to cover particular modifications, equivalents, and alternatives falling within the spirit and scope of the present invention.

It will be understood that, although the terms "first," "second," and the like may be used herein to describe various elements, these elements should not be limited by these terms. These terms are only used to distinguish one element from another. For example, a first element could be termed a second element, and a second element could similarly be termed a first element without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terms used herein are for the purpose of describing particular exemplary embodiments only and are not intended to be limiting to the present invention. As used herein, singular forms are intended to include plural forms as well, unless the context clearly indicates otherwise. In the present application, it will be further understood that the terms "comprise," "comprising," "include," and/or "including", when used in this specification, specify the presence of stated features, integers, steps, operations, elements, components and/or groups thereof but do not preclude the presence or addition of one or more other features, integers, steps, operations, elements, components and/or groups thereof.

Unless otherwise defined, all terms used herein including technical or scientific terms have the same meanings as those generally understood by one of ordinary skill in the art. It should be further understood that terms, such as those defined in commonly used dictionaries, should be interpreted as having a meaning that is consistent with their meaning in the context of the relevant art and are not to be interpreted in an idealized or overly formal sense unless expressly so defined herein.

Hereinafter, embodiments of the present invention will be described in detail with reference to the accompanying drawings. Regardless of reference numerals, like numbers refer to like elements throughout the description of the figures, and the description of the same elements will be not reiterated.

In addition, a semiconductor device package according to the present embodiment may include a small-sized semiconductor device. Here, the small-sized semiconductor device may refer to a structural size of a semiconductor device. In addition, the small-sized semiconductor device may have a structural size of several micrometers to several hundreds of micrometers. In addition, the semiconductor device according to the embodiment may have a structural size of 30 μm to 60 μm as will be described below, but the present invention is not necessarily limited thereto. In addition, technical features or aspects of embodiments may be applied to a semiconductor device with a smaller size scale.

FIG. 1A is a perspective view of a semiconductor device according to one embodiment, FIG. 1B is a cross-sectional view of the semiconductor device according to one embodiment, and FIG. 2 is a plan view of the semiconductor device according to one embodiment.

Referring to FIGS. 1A, 1B, and 2, the semiconductor device according to one embodiment may include a semiconductor structure 140, a first electrode 151, a second electrode 152, and an insulating layer 160.

Specifically, the semiconductor device may include a sacrificial layer 120, a coupling layer 130 disposed on the sacrificial layer 120, an intermediate layer 170 disposed on the coupling layer 130, a first conductive semiconductor layer 141 disposed on the intermediate layer 170, a first clad layer 144 disposed on the first conductive semiconductor layer, an active layer 142 disposed on the first clad layer 144, a second conductive semiconductor layer 143 disposed on the active layer 142, the first electrode 151 electrically connected to the first conductive semiconductor layer, the second electrode 152 electrically connected to the second conductive semiconductor layer, and the insulating layer 160 surrounding the sacrificial layer 120, the coupling layer 130, the first conductive semiconductor layer 141, the first clad layer 144, the active layer 142, and the second conductive semiconductor layer 143.

First, the sacrificial layer 120 may be a layer disposed at a lowermost portion of the semiconductor device according to the embodiment. That is, the sacrificial layer 120 may be a layer disposed at an outermost side in a first-second direction ($X_2$ direction). The sacrificial layer 120 may be disposed on a substrate (not shown).

Here, a first direction (X direction) includes a first-first direction ($X_1$ direction) and the first-second direction ($X_2$ direction) in a thickness direction of the semiconductor structure 140. The first-first direction ($X_1$ direction) is a direction toward the second conductive semiconductor layer 143 from the first conductive semiconductor layer 141 among thickness directions of the semiconductor structure 140. In addition, the first-second direction is a direction toward the first conductive semiconductor layer 141 from the second conductive semiconductor layer 143 among the thickness directions of the semiconductor structure 140 and is a direction opposite to the first-first direction. Also, here, a second direction (Y direction) may be a direction perpendicular to the first direction (X direction). In addition, the second direction (Y direction) includes a second-first direction ($Y_1$ direction) and a second-second direction ($Y_2$ direction), and the second-first direction ($Y_1$ direction) is a direction opposite to the second-second direction ($Y_2$ direction).

The sacrificial layer 120 may be a layer that remains when the semiconductor device is transferred to a display apparatus. For example, when the semiconductor device is transferred to the display apparatus, the sacrificial layer 120 may be separated from the semiconductor device by laser light emitted during the transfer. For example, a portion of the sacrificial layer 120 may be separated by the laser light, and the remaining portion thereof may be left. However, the present invention is not limited thereto and the sacrificial layer 120 may be completely removed. The sacrificial layer 120 may include a material that is separable at a wavelength of the emitted laser light, and the wavelength of the laser light may be one of 266 nm, 532 nm, and 1064 nm, but the present invention is not limited thereto.

The sacrificial layer 120 may include an oxide or a nitride. However, the present invention is not limited thereto. For example, the sacrificial layer 120 may include an oxide-based material, which is a material that is less deformed during epitaxial growth.

The sacrificial layer 120 may include at least one among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, $IrO_x$, $RuO_x$, NiO, $RuO_x$/ITO, Ni/$IrO_x$/Au, Ni/$IrO_x$/Au/ITO, silver (Ag), nickel (Ni), chromium (Cr), titanium (Ti), aluminum (Al), rhodium (Rh), palladium (Pd), iridium (Ir), tin (Sn), indium (In), ruthenium (Ru), magnesium (Mg), zinc (Zn), platinum (Pt), gold (Au), and hafnium (Hf).

The sacrificial layer 120 may have a thickness of 20 nm or more in the first direction (X direction). Preferably, the sacrificial layer 120 may have a thickness of 40 nm or more in the first direction (X direction). However, the present invention is not limited to such a length.

The sacrificial layer 120 may be formed using an e-beam evaporation method, a thermal evaporation method, a metal-organic chemical vapor deposition (MOCVD) method, a sputtering method, and a pulsed laser deposition (PLD) method, but the present invention is not limited thereto.

The coupling layer 130 may be disposed on the sacrificial layer 120. The coupling layer 130 may include materials such as $SiO_2$, $SiN_x$, $TiO_2$, polyimide, and a resin.

The coupling layer 130 may have a thickness of 30 nm to 1 μm. However, the present invention is not limited thereto. Here, the thickness may be a length in an X-axis direction. The coupling layer 130 may be annealed to bond the sacrificial layer 120 and the intermediate layer 170 to each other. In this case, hydrogen ions are discharged from the coupling layer 130, and thus delamination may occur. Thus, the coupling layer 130 may have a surface roughness of 1 nm or less. With such a configuration, a separation layer (see FIG. 10B) and the coupling layer may be easily bonded to each other. The placement positions of the coupling layer 130 and the sacrificial layer 120 may be switched with each other.

The intermediate layer 170 may be disposed on the coupling layer 130. The intermediate layer 170 may include GaAs. The intermediate layer 170 may be coupled to the sacrificial layer 120 through the coupling layer 130.

Further, the semiconductor structure 140 may be disposed on the intermediate layer 170. The semiconductor structure 140 may include the first conductive semiconductor layer 141 disposed on the intermediate layer 170, the first clad layer 144 disposed on the first conductive semiconductor layer, the active layer 142 disposed on the first clad layer 144, and the second conductive semiconductor layer 143 disposed on the active layer 142.

The first conductive semiconductor layer 141 may be disposed on the intermediate layer 170. The first conductive semiconductor layer 141 may have a thickness of 0.5 μm to 2 μm. However, the present invention is not limited thereto.

The first conductive semiconductor layer 141 may be implemented with a compound semiconductor including a III-V group element, a II-VI group element, or the like and may be doped with a first dopant. The first conductive semiconductor layer 141 may include a semiconductor material having a composition formula of $In_xAl_yGa_{1-x-y}P$ ($0 \leq x \leq 1$, $0 \leq y \leq 1$, and $0 \leq x+y \leq 1$) or $In_xAl_yGa_{1-x-y}N$ ($0 \leq x \leq 1$, $0 \leq y \leq 1$, and $0 \leq x+y \leq 1$).

In addition, the first dopant may be an n-type dopant such as Si, Ge, Sn, Se, or Te. When the first dopant is an n-type dopant, the first conductive semiconductor layer 141 doped with the first dopant may be an n-type semiconductor layer.

The first conductive semiconductor layer 141 may include at least one among AlGaP, InGaP, AlInGaP, InP, GaN, InN, AlN, InGaN, AlGaN, InAlGaN, AlInN, AlGaAs, InGaAs, AlInGaAs, and GaP.

The first conductive semiconductor layer 141 may be formed using a chemical vapor deposition (CVD) method, a molecular beam epitaxy (MBE) method, a sputtering method, a hydride vapor phase epitaxy (HVPE) method, or the like, but the present invention is not limited thereto.

An etch stop layer (not shown) and a reflective layer (not shown) may be disposed between the intermediate layer 170 and the first conductive semiconductor layer 141.

For example, the etch stop layer (not shown) may include GaInP and may have a thickness of 100 nm to 200 nm, but the present invention is not limited thereto. The etch stop layer may limit an etching depth in an etching process.

In addition, the reflective layer (not shown) may have a distributed Bragg reflector (DBR) structure and may include, for example, AlGaAs. In addition, the reflective layer (not shown) may have a structure in which a plurality of materials having different composition ratios of Al and Ga are alternately stacked. For example, the reflective layer (not shown) may have a structure in which 26 pairs of a first layer including $Al_{0.5}GaAs$ and having a thickness of 46 nm and a second layer including $Al_{0.9}GaAs$ and having a thickness of 51 nm are stacked. However, the present invention is not limited thereto.

Thus, the reflective layer (not shown) may reflect light of a certain wavelength. For example, the reflective layer (not shown) may reflect red light. That is, the reflective layer (not shown) may increase the bandwidth of a stop band by applying a multiple DBR rather than a single DBR, thereby providing an effect of increasing reflectivity and improving luminous flux. In addition, the reflective layer (not shown) may be formed of a plurality of layers having different refractive indices.

The first clad layer 144 may be disposed on the first conductive semiconductor layer 141. The first clad layer 144 may be disposed between the first conductive semiconductor layer 141 and the active layer 142. The first clad layer 144 may include a plurality of layers. The first clad layer 144 may include an AlInP-based layer/AlInGaP-based layer.

The active layer 142 may be disposed on the first clad layer 144. The active layer 142 may be disposed between the first conductive semiconductor layer 141 and the second conductive semiconductor layer 143. The active layer 142 is a layer at which electrons (or holes) injected through the first conductive semiconductor layer 141 and holes (or electrons) injected through the second conductive semiconductor layer 143 meet. As the electrons and the holes are recombined and transitioned to a low energy level, the active layer 142 may generate light. For example, the active layer 142 may generate light having an ultraviolet wavelength band as a peak wavelength. However, the present invention is not limited to such a wavelength band.

The active layer 142 may have one structure from among a single-well structure, a multi-well structure, a single quantum well structure, a multi-quantum well (MQW) structure, a quantum dot structure, and a quantum-wire structure. For example, the active layer 142 may include a well layer and a barrier layer that are alternately disposed.

The active layer 142 may be formed as a pair structure of one or more of GaInP/AlGaInP, GaP/AlGaP, InGaP/AlGaP, InGaN/GaN, InGaN/InGaN, GaN/AlGaN, InAlGaN/GaN, GaAs/AlGaAs, and InGaAs/AlGaAs, but the present invention is not limited thereto. For example, the well layer may include GaInP and the barrier layer may include AlGaInP. Each of the well layer and the barrier layer may have a thickness of 7 nm, but the present invention is not limited thereto.

The active layer 142 may have a thickness of 0.2 μm to 0.7 μm. However, the present invention is not limited thereto.

In addition, electrons are cooled in the first clad layer 144 so that the active layer 142 may generate more radiation recombination.

The second conductive semiconductor layer 143 may be disposed on the active layer 142. The second conductive semiconductor layer 143 may include a second-first conductive semiconductor layer 143a and a second-second conductive semiconductor layer 143b.

The second-first conductive semiconductor layer 143a may be disposed on the active layer 142. The second-second conductive semiconductor layer 143b may be disposed on the second-first conductive semiconductor layer 143a.

The second-first conductive semiconductor layer 143a may include TSBR and P—AlInP. However, the present invention is not limited thereto.

The second-first conductive semiconductor layer 143a may be implemented with a group III-V or group II-VI compound semiconductor, or the like. The second-first conductive semiconductor layer 143a may be doped with a second dopant.

The second-first conductive semiconductor layer 143a may include a semiconductor material having a composition formula of $In_xAl_yGa_{1-x-y}P$ ($0<x<=1$, $0<=y<=1$, and $0<=x+y<=1$) or $In_xAl_yGa_{1-x-y}N$ ($0<x<=1$, $0<=y<=1$, and $0<=x+y<=1$). When the second conductive semiconductor layer 143 is a p-type semiconductor layer, the second conductive semiconductor layer 143 may include Mg, Zn, Ca, Sr, Ba or the like as a p-type dopant.

The second-first conductive semiconductor layer 143a doped with the second dopant may be a p-type semiconductor layer.

The second-second conductive semiconductor layer 143b may be disposed on the second-first conductive semiconductor layer 143a. The second-second conductive semiconductor layer 143b may include a p-type GaP-based layer.

The second-second conductive semiconductor layer 143b may include a superlattice structure of GaP layer/$In_xGa_{1-x}P$ layer ($0≤x<=1$).

In one embodiment, the second-second conductive semiconductor layer 143b may be doped with the second dopant at a predetermined doping concentration. For example, the second-second conductive semiconductor layer 143b may be doped with Mg at a concentration of about $10×10^{-18}$, but the present invention is not limited thereto. Also, the second-second conductive semiconductor layer 143b may be formed of a plurality of layers, only some of which may be doped with Mg.

The first electrode 151 may be disposed on the first conductive semiconductor layer 141. The first electrode 151 may be electrically connected to the first conductive semiconductor layer 141.

The first electrode 151 may be disposed on a portion of an upper surface of the first conductive semiconductor layer 141 in which mesa etching is performed. Thus, the first electrode 151 may be disposed further downward than the second electrode 152 which is disposed on an upper surface of the second conductive semiconductor layer 143.

The first electrode 151 may be formed to include at least one among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, $IrO_x$, $RuO_x$, NiO, $RuO_x$/ITO, Ni/$IrO_x$/Au, Ni/$IrO_x$/Au/ITO, Ag, Ni, Cr, Ti, Al, Rh, Pd, Ir, Sn, In, Ru, Mg, Zn, Pt, Au, and Hf, but the present invention is not limited to such materials.

All electrode formation methods that are typically used, such as a sputtering method, a coating method, and a deposition method, may be applied to the first electrode 151.

As described above, the second electrode 152 may be disposed on the second-second conductive semiconductor layer 143b. The second electrode 152 may be electrically connected to the second-second conductive semiconductor layer 143b.

The second electrode 152 may be formed to include at least one among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, $IrO_x$, $RuO_x$, NiO, $RuO_x$/ITO, Ni/$IrO_x$/Au, Ni/$IrO_x$/Au/ITO, Ag, Ni, Cr, Ti, Al, Rh, Pd, Ir, Sn, In, Ru, Mg, Zn, Pt, Au, and Hf, but the present invention is not limited to such materials.

All electrode formation methods that are typically used, such as a sputtering method, a coating method, and a deposition method, may be applied to the second electrode 152.

The insulating layer 160 may cover the sacrificial layer 120, the coupling layer 130, and the semiconductor structure 140. That is, the insulating layer 160 may be disposed at outer sides of the sacrificial layer 120, the coupling layer 130, and the semiconductor structure 140 to cover a side surface of the sacrificial layer 120 and a side surface of the coupling layer 130. In addition, the insulating layer 160 may cover a portion of an upper surface of the first electrode 151. With such a configuration, the first electrode 151 is electrically connected to an electrode or pad through an exposed upper surface so that current may be injected into the first electrode 151. Like the first electrode 151, the second electrode 152 may include an exposed upper surface. The insulating layer 160 covers the sacrificial layer 120 and the coupling layer 130 so that the sacrificial layer 120 and the coupling layer 130 may not be exposed to the outside.

The insulating layer 160 may cover a portion of the upper surface of the first electrode 151. Also, the insulating layer 160 may cover a portion of an upper surface of the second electrode 152. A portion of the upper surface of the first electrode 151 may be exposed. A portion of the upper surface of the second electrode 152 may be exposed.

The exposed upper surface of the first electrode 151 and the exposed upper surface of the second electrode 152 may each have various shapes.

In the semiconductor structure 140, the insulating layer 160 may electrically separate the first conductive semiconductor layer 141 from the second conductive semiconductor layer 143. The insulating layer 160 may be formed of at least one selected from the group consisting of $SiO_2$, $SixO_y$, $Si_3N_4$, $Si_xN_y$, $SiO_xN_y$, $Al_2O_3$, $TiO_2$, AlN, and the like, but the present invention is not limited thereto.

Further, upper surfaces S1, S2, and S3 of the semiconductor structure 140 according to the embodiment may include a first upper surface S1 on which the first electrode 151 is disposed, a second upper surface S2 on which the second electrode 152 is disposed, and an inclined surface S3 disposed between the first upper surface S1 and the second upper surface S2.

Further, the active layer 142 may include first outer side surfaces P1 and P2. In addition, the first outer side surfaces may include a first-first outer side surface P1 and a first-second outer side surface P2.

In addition, the semiconductor structure 140 may further include a second outer side surface S4.

Here, the first upper surface S1 is in contact with the first electrode 151 and may be defined as a surface through which the first conductive semiconductor layer 141 is exposed, and the second upper surface S2 is in contact with the second electrode 152 and may be defined as the upper surface of the second conductive semiconductor layer 143. In addition, the inclined surface S3 is formed by mesa etching and may be defined as an inclined region disposed between the first upper surface S1 and the second upper surface S2. In addition, the first upper surface S1 may be disposed further downward than the second upper surface S2. In addition, one end portion of the inclined surface S3 may be in contact with the first upper surface S1 and the other end portion thereof may be in contact with the second upper surface S2.

In addition, the first-first outer side surface P1 may be defined as a side surface through which the active layer 142 is exposed at the inclined surface S3, and the first-second outer side surface P2 may be defined as a side surface through which the remaining portion of the active layer 142 other than the first-first outer side surface P1 is exposed. In addition, the second outer side surface S4 may be defined as a side surface of the semiconductor structure 140 including the first-second outer side surface P2.

In addition, the second outer side surface S4 may include a second-first outer side surface S41, a second-second outer side surface S42, and a second-third outer surface S43. The second-second outer side surface S42 is positioned to face the inclined surface S3, and the second-first outer side surface S41 and the second-third outer surface S43 may be defined as outer side surfaces of the light-emitting structure 140 positioned between the second-second outer side surface S42 and the inclined surface S3. In addition, hereinafter, a "chip size" refers to an area of the second upper surface S2.

In the semiconductor device according to the embodiment, a ratio of an area (chip size) of the second upper surface S2 and an area of the first outer side surfaces P1 and P2 may be in a range of 1:0.0005 to 1:0.01.

In the semiconductor device according to the embodiment, optical performance may be enhanced with such a configuration. Specifically, in the semiconductor device, as the area of the first outer side surfaces P1 and P2 is increased, Shockley-Read-Hall (SRH) recombination occurs due to defects on the exposed surface, and carrier loss increases due to the SRH recombination, and thus optical performance may be degraded. In addition, the area of the first outer side surfaces P1 and P2 may be changed according to the number of pairs of the active layer 142 (hereinafter, referred to as the number of well layers/barrier layers or each number of well layers and barrier layers). For example, when the number of pairs of the active layer 142 increases, the area of the first outer side surfaces P1 and P2 also increases, and thus the carrier loss due to the SRH recombination may increase.

Further, as the area of the second upper surface S2 is changed, external quantum efficiency (EQE) may also be changed in the small-sized semiconductor device described above. For example, when the area of the second upper surface S2 is reduced, the current injection may be reduced, and thus the EQE may be decreased.

Accordingly, when the area of the second upper surface S2 is increased in order to improve the EQE, the area of the outer side surfaces P1 and P2 of the active layer 142 is also increased, and thus the SRH recombination caused by the defects of the outer side surfaces P1 and P2 may be increased. Thus, in the semiconductor device according to the embodiment, carrier loss and leakage current may be controlled by optimizing the ratio of the area of the outer side surfaces P1 and P2 and the area of the second upper surface S2 so that the optical performance may be enhanced.

Further, when the ratio of the area of the second upper surface S2 and the area of the first outer side surfaces P1 and P2 is less than 1:0.0005, there is a problem in that current injection is decreased. In addition, when the ratio of the area of the second upper surface S2 and the area of the first outer side surfaces P1 and P2 is greater than 1:0.01, the SRH recombination increases at the first outer side surfaces P1 and P2, and thus there is a problem in that carrier loss increases.

The above contents will be described in detail with reference to FIGS. 3 to 8.

In addition, a first angle θ2 formed between the inclined surface S3 and a virtual horizontal plane may be in a range of 20° to 80°. When the first angle θ2 is less than 20°, the area of the second upper surface S2 is decreased, and thus optical output power may be degraded. In addition, when the first angle θ2 is greater than 80°, the inclination angle is increased, and thus a risk of breakage due to an external impact may be increased.

Also, a second angle θ1 formed between the side surface of the semiconductor structure 140 and a horizontal plane of the semiconductor structure 140 may be in a range of 70° to 90°. When the second angle θ1 is less than 70°, the area of the second upper surface S2 is decreased, and thus optical output power may be degraded.

In addition, the first-first outer side surface P1 may be disposed closer to the first upper surface than the second upper surface S2 at the inclined surface S3. As one example, at the inclined surface S3, a minimum distance between the first-first outer side surface P1 and the second upper surface S2 may be less than a minimum distance between the first-first outer side surface P1 and the first upper surface S1. With such a configuration, the exposed area of the active layer 142 may be reduced and light efficiency degradation may be prevented. In particular, when the first angle θ1 is greater than the second angle θ2 as described above, since the area of the first-first outer side surface P1 at the inclined surface S3 is greater than the area of the first-second outer side surface P2 described above, the light efficiency degradation due to the carrier loss may be more efficiently prevented.

In addition, the second upper surface S2 may be higher than the first upper surface S1 by as much as the thickness of the etched portion. That is, as the etching becomes deeper, a height difference d3 between the first upper surface S1 and the second upper surface S2 may increase.

When the height difference d3 between the first upper surface S1 and the second upper surface S2 is greater than 2 μm, the level of the chip may be deviated during a transfer process. The transfer process may refer to the operation of transferring a chip from a growth substrate. That is, as a step height increases, it may become difficult for the chip to remain level.

A ratio (d1:d2) of a first minimum height d1 from a bottom surface B1 of the semiconductor structure 140 to the second upper surface S2 to a second minimum height d2 from the bottom surface B1 of the semiconductor structure 140 to the first upper surface S1 may be in a range of 1:0.6 to 1:0.95. When the height ratio (d1:d2) is less than 1:0.6, the step height is increased, and thus a defect rate may be increased during a transfer process. When the height ratio is less than 1:0.95, a mess-etching depth is decreased, and thus the first conductive semiconductor layer 141 may not be partially exposed.

The first minimum height d1 from the bottom surface of the semiconductor structure 140 to the second upper surface S2 may be in a range of 5 μm to 8 μm. That is, the first minimum height d1 may be the entire thickness of the semiconductor structure 140. The second minimum height d2 from the bottom surface of the semiconductor structure 140 to the first upper surface S1 may be in a range of 3.0 μm to 7.6 μm.

In this case, the difference d3 between the first minimum height d1 and the second minimum height d2 may be 350 nm or more and 2.0 μm or less. When the height difference d3 is greater than 2.0 μm, misalignment occurs while a semiconductor device is being transferred, and thus there is a problem in that it is difficult to transfer the semiconductor device to a desired position. In addition, when the height difference d3 is less than 350 nm, the first conductive semiconductor layer 121 may not be partially exposed.

When the difference d3 between the first minimum height d1 and the second minimum height d2 is less than or equal to 1.0 μm, the upper surface of the semiconductor structure may become almost flat, and thus the transfer process may be more easily performed and the occurrence of cracks may be suppressed. As an example, the difference d3 between the first minimum height d1 and the second minimum height d2 may be 0.6 μm±0.2 μm, but the present invention is not necessarily limited thereto.

FIG. 3 is a graph illustrating light efficiency with respect to current density for each area of the second upper surface shown in Table 1, and FIGS. 4 and 5 are graphs respectively illustrating an S value with respect to current density and an ideality factor for each area of the second upper surface shown in Table 1.

First, FIGS. 3 to 5 illustrate experimental results for Comparative Examples 1 and 2 (#1 and #2) and Examples 1, 2, 3, and 4 (#3, #4, #5, and #6) shown in Table 1 below.

Specifically, Table 1 illustrates semiconductor devices in which the area of the second upper surface S2 is changed from $15^2$ μm$^2$ to $350^2$ μm$^2$. In addition, the semiconductor device is composed of a multi-quantum well (MQW) structure containing n-GaAs, 4.0 μm thick n-$(Al_{0.5}Ga_{0.5})_{0.5}In_{0.5}P$ on n-GaAs, 50 nm thick AlInP on n-$(Al_{0.5}Ga_{0.5})_{0.5}In_{0.5}P$, and 20 pairs of $Ga_{0.5}In_{0.5}P$ (thickness: 7 nm)/$Al_{0.7}Ga_{0.3})_{0.5}In_{0.5}P$ (thickness: 14 nm) on AlInP, 50 nm thick AlInP on the MQW structure, and 200 nm thick p-$Al_{0.5}In_{0.5}P$, 0.5 μm thick p-GaP, and 20 nm thick p++-GaP on AlInP. Only the chip size and the number of semiconductor devices were changed. In addition, in the following, the number of well layers/barrier layers of the semiconductor device was sometimes changed, but other structures thereof have been applied in the same manner.

TABLE 1

| No. | Area of second upper surface (=chip size) (μm × μm = μm$^2$) | Number of semiconductor devices (pcs) | Total area of chip (=area of second upper surface x = number of semiconductor device) (μm × μm = μm$^2$) | Ratio of area of second upper surface and area of first outer side surfaces |
|---|---|---|---|---|
| Comparative Example 1 (#1) | 15 × 15 = 225 | 10 | 2250 | 0.0320 |
| Comparative Example 2 (#2) | 22 × 22 = 484 | 10 | 4840 | 0.0218 |
| Example 1 (#3) | 50 × 50 = 2,500 | 10 | 25000 | 0.0096 |
| Example 2 (#4) | 100 × 100 = 10,000 | 1 | 10000 | 0.0048 |
| Example 3 (#5) | 150 × 150 = 22,500 | 1 | 22500 | 0.0032 |
| Example 4 (#6) | 350 × 350 = 122,500 | 1 | 122500 | 0.0014 |

Referring to FIGS. 3 and 4, it can be seen that as the ratio of the area of the second upper surface and the area of the first outer side surfaces decreases, the EQE decreases and the S value also decreases. In detail, it can be seen that the EQE is dependent on the ratio of the area of the second upper surface and the area of the first outer side surfaces in Examples 1, 2, 3, and 4 and Comparative Examples 1 and 2. For example, it can be seen that the EQE is maximized at a high current density as the ratio of the area of the second upper surface and the area of the first outer side surfaces decreases. In addition, since the EQE of Example 1 (#3) appears to be less than those of Examples 2 and 3 (#4 and #5) even when the total area of the second upper surface of Example 1 (#3) has a great difference from the total area of the second upper surface of each of Examples 2 and 3 (#4 and #5), it can be seen that the EQE is controlled according to the ratio of the area of the second upper surface and the area of the first outer side surfaces.

In addition, Example 4 (#6) has a great difference in total area from Examples 1, 2, and 3 (#3, #4, and #5), but has the EQE similar to those of Examples 1, 2, and 3 (#3, #4, and #5). Accordingly, it can be seen that when the ratio of the area of the second upper surface and the area of the first outer side surfaces is in a range of 1:0.0005 to 1:0.01, SRH recombination decreases so that the EQE is improved.

In addition, as described above, the S value in Examples 1, 2, 3, and 4 (#3, #4, #5, and #6) may be less than or equal to 2 at a current injection of 0.1 mA/cm². However, it can be seen that the S value is greater than 2 in Comparative Examples 1 and 2 (#1 and #2) and thus the leakage current increases. Here, S may be defined as ∂ ln L/∂ ln 1.

Here, L is defined as $L=\eta_c BN^2$, where L refers to optical output power, $\eta_c$ refers to coupling efficiency, B refers to a radiative recombination coefficient, and N refers to a carrier concentration in the active layer.

That is, it can be seen that when the ratio of the area of the second upper surface and the area of the first outer side surfaces is greater than 1:0.01, the S value increases to a value greater than 2 (the current density is 0.1 A/cm²) so that the leakage current increases, thereby degrading the optical output power.

In FIG. 5, the ideality factor is represented by $n_{ideality}$ which satisfies Equation 1 below, $$n_{ideality} = \frac{q}{kT}\left(\frac{\partial \ln I}{\partial V}\right)^{-1} \quad \text{[Equation 1]}$$

where q represents elementary charge, k represents the Boltzmann constant, and T represents temperature. In addition, I represents current and V represents voltage.

In addition, the ideality factor is obtained as a function of the current density, the ideality factor of 2 causes SRH recombination, and when the ideality factor exceeds 2, a tunneling phenomenon occurs due to defects and thus carrier loss increases due to the SRH recombination.

Accordingly, it can be seen that the ideality factor is less than 2 in Examples 1, 2, 3, and 4 (#3, #4, #5, and #6), but the ideality factor is close to 2 in Comparative Examples 1 and 2 (#1 and #2) so that carrier loss increases due to the SRH recombination.

FIG. 6 is a graph illustrating the EQE with respect to current density for the number of well layers/barrier layers, FIG. 7 is a graph illustrating the ratio of the area of the outer side surfaces of the active layer and the area of the second upper surface for the number of well layers/barrier layers, and FIG. 8 is a graph illustrating relative optical output power with respect to the number of well layers/barrier layers for the area of the second upper surface.

First, in FIG. 6, it can be seen that in the case of a chip size of 30 μm×30 μm and a low current density (5 A/cm² or less), the EQE is relatively increased as the number of well layers/barrier layers increases. In the following, the number of well layers/barrier layers may be equal to the number of pairs of well layers/barrier layers in the active layer.

In addition, referring to FIG. 7, it can be seen that as the chip size decreases, the ratio of the area of the upper surface of the second conductive semiconductor layer and the area of the outer side surfaces of the active layer increases. In addition, it can be seen that as the number of well layers/barrier layers increases, the ratio of the area of the upper surface of the second conductive semiconductor layer and the area of the outer side surfaces of the active layer also increases.

That is, it can be seen that the area of the outer side surfaces of the active layer (the area of the active layer exposed to the outside) is changed according to the number of well layers/barrier layers. For example, it shows that when the number of well layers/barrier layers increases, the area of the outer side surfaces of the active layer (the area of the active layer exposed to the outside) increases.

That is, depending on the factor (the number of well layers/barrier layers) that changes the area of the outer side surfaces of the active layer, the ratio of the area of the upper surface of the second conductive semiconductor layer and the area of the outer side surfaces of the active layer may be changed, and as shown in FIG. 6, the EQE may also be changed.

In addition, it can be seen that when the number of well layers/barrier layers is 30 or less, the ratio of the area of the upper surface of the second conductive semiconductor layer and the area of the outer side surfaces of the active layer of 1:0.01 or less may be secured.

In addition, FIG. 8 shows that when the chip size is equal to 30² μm², an optical output power Po increases as the number of well layers/barrier layers decreases. In contrast, it shows that when the chip size is equal to 1000² μm², the optical output power increases as the number of well layers/barrier layers increases. Accordingly, it can be seen that optical output power is improved as the number of well layers/barrier layers decreases in the size of a chip having one side whose length ranges from several micrometers to several hundreds of micrometers as in the semiconductor device according to the embodiment. This is also because, when the chip size is less than or equal to several hundred square micrometers, the effect of current loss due to the area of the outer side surfaces of the active layer, which occurs as the number of well layers/barrier layers increases, is greater than the effect of improving optical efficiency due to photoelectron distribution resulting from an increase in the number of well layers/barrier layers.

Further, it can be seen that, in a chip size of several hundred square micrometers or less, when the number of well layers/barrier layers exceeds 10, optical output power is rapidly degraded. Accordingly, the semiconductor device according to the embodiment may provide an improved optical output power by having the number of well layers/barrier layers of 1 to 10.

FIG. 9 is a cross-sectional view of a semiconductor device according to another embodiment.

Referring to FIG. 9, the semiconductor device according to another embodiment may include a semiconductor structure 140, a first electrode 131, a second electrode 132, and an insulating layer 160.

The semiconductor structure 140 may include a first conductive semiconductor layer 141, an active layer 142, and a second conductive semiconductor layer 143. The semiconductor structure 140 may have a structure in which the first conductive semiconductor layer 141, the active layer 142, and the second conductive semiconductor layer 143 are sequentially stacked in a first-first direction ($X_1$-axis direction).

The semiconductor structure 140 may be formed using a metal-organic chemical vapor deposition (MOCVD) method, a chemical vapor deposition (CVD) method, a plasma-enhanced chemical vapor deposition (PECVD) method, a molecular-beam epitaxy (MBE) method, a hydride vapor phase epitaxy (HVPE) method, a sputtering method, or the like.

The first conductive semiconductor layer 141 may be implemented with a compound semiconductor including a III-V group element, a II-VI group element, or the like and may be doped with a first dopant. The first conductive semiconductor layer 141 may be formed of a semiconductor material having a composition formula of $Al_xIn_yGa_{(1-x-y)}$ ($0=x<=1$, $0<=y<=1$, and $0<=x+y<=1$) or at least one among InAlGaN, AlGaAs, GaP, GaAs, GaAsP, and AlGaInP, but the present invention is not limited thereto. When the first dopant is an n-type dopant such as silicon (Si), germanium (Ge), tin (Sn), selenium (Se), tellurium (Te), or the like, the first conductive semiconductor layer 141 may be an n-type nitride semiconductor layer.

The first conductive semiconductor layer 141 may have a thickness of 3.0 μm to 6.0 μm in the first-first direction ($X_1$-axis direction), but the present invention is not limited thereto.

The active layer 142 may be disposed on the first conductive semiconductor layer 141. In addition, the active layer 142 may be disposed between the first conductive semiconductor layer 141 and the second conductive semiconductor layer 143.

The active layer 142 may have a thickness of 100 nm to 180 nm in the first-first direction (X1-axis direction). However, the present invention is not limited to such a length, and the length may be variously changed depending on the size of a semiconductor device 10.

The active layer 142 is a layer at which electrons (or holes) injected through the first conductive semiconductor layer 141 and holes (or electrons) injected through the second conductive semiconductor layer 143 meet. The active layer 142 may transition to a low energy level due to the recombination of electrons and holes and emit light having a wavelength corresponding thereto.

The active layer 142 may have one structure among a single well structure, a multi-well structure, a single quantum well structure, a multi-quantum well (MQW) structure, a quantum dot structure, and a quantum wire structure, but the structure of the active layer 142 is not limited thereto. The active layer may generate light of the visible light wavelength range. As an example, the active layer may output light in one of blue and green wavelength ranges.

The second conductive semiconductor layer 143 may be disposed on the active layer 142. The second conductive semiconductor layer 143 may be implemented with a compound semiconductor including a III-V group element, a II-VI group element, or the like and may be doped with a second dopant. The second conductive semiconductor layer 143 may be formed of semiconductor materials having a composition formula of $In_{x5}Al_{y2}Ga_{1-x5-y2}N$ ($0≤x5<=1$, $0<=y2<=1$, and $0<=x5+y2<=1$) or materials selected from among AlInN, AlGaAs, GaP, GaAs, GaAsP, and AlGaInP. When the second dopant is a p-type dopant such as magnesium (Mg), zinc (Zn), calcium (Ca), strontium (Sr), barium (Ba), or the like, the second conductive semiconductor layer 143 doped with the second dopant may be a p-type semiconductor layer.

The second conductive semiconductor layer 143 may have a thickness of 250 nm to 350 nm in the first direction ($X_1$-axis direction). However, the present invention is not limited to such a thickness.

The first electrode 131 may be disposed on the first conductive semiconductor layer 141. Here, the first conductive semiconductor layer 141 may be partially exposed by etching. The first electrode 131 may be disposed on the first conductive semiconductor layer 141 exposed by etching.

The first electrode 131 may be electrically connected to the first conductive semiconductor layer 141. The second electrode 132 may be disposed on the second conductive semiconductor layer 143. The second electrode 132 may be electrically connected to the second conductive semiconductor layer 143.

The first electrode 131 and the second electrode 132 may be formed to include at least one among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, $IrO_x$, $RuO_x$, NiO, $RuO_x$/ITO, Ni/$IrO_x$/Au, but the present invention is not limited to such materials. As an example, the first electrode 131 and the second electrode 132 may include indium tin oxide (ITO), but the present invention is not necessarily limited thereto.

The first electrode 131 and the second electrode 132 may each have a thickness of 40 nm to 70 nm. However, the present invention is not necessarily limited thereto, and the first electrode 131 and the second electrode 132 may have different thicknesses and compositions.

The insulating layer 160 may be disposed on an upper surface and a side surface of the semiconductor structure. The insulating layer may include holes H1 and H2 that partially expose the first electrode 131 and the second electrode 132.

The insulating layer 160 may electrically insulate the semiconductor structure 140 from the outside. The insulating layer 160 may include at least one among $SiO_2$, $SixO_y$, $Si_3N_4$, $Si_xN_y$, $SiO_xN_y$, $Al_2O_3$, $TiO_2$, and AlN, but the present invention is not limited thereto.

Unlike the above-described semiconductor device illustrated in FIG. 1A, the semiconductor device according to another embodiment may not include an intermediate layer 170, a coupling layer 130, and a sacrificial layer 120 that are disposed below the first conductive semiconductor layer 141. Except for this structural difference, the contents for the remaining structures may be applied in the same manner as described with reference to FIGS. 1A to 3.

For example, upper surfaces S1, S2, and S3 of the semiconductor structure 140 may include a first upper surface S1 on which the first electrode 151 is disposed, a second upper surface S2 on which the second electrode 152 is disposed, and an inclined surface S3 disposed between the first upper surface S1 and the second upper surface S2.

Further, the active layer 142 may include first outer side surfaces P1 and P2. In addition, the first outer side surfaces may include a first-first outer side surface P1 and a first-second outer side surface P2.

In addition, the semiconductor structure 140 may further include a second outer side surface S4.

Here, the first upper surface S1 may be defined as a surface through which the first conductive semiconductor layer 141 is exposed, and the second upper surface S2 may be defined as the upper surface of the second conductive semiconductor layer 143. In addition, the inclined surface S3 is formed by mesa etching and may be defined as an inclined region disposed between the first upper surface S1 and the second upper surface S2.

In addition, the first-first outer side surface P1 may be defined as a side surface through which the active layer 142 is exposed at the inclined surface S3, and the first-second outer side surface P2 may be defined as a side surface through which the remaining portion other than the first-first outer side surface P1 is exposed. In addition, the second outer side surface S4 may be defined as a side surface of the semiconductor structure 140 including the first-second outer side surface P2. In addition, the second outer side surface S4 may include a second-first outer side surface S41, a second-second outer side surface S42, and a second-third outer surface S43. The second-second outer side surface S42 is positioned to face the inclined surface S3, and the second-first outer side surface S41 and the second-third outer surface S43 may be defined as outer side surfaces positioned between the second-second outer side surface S42 and the inclined surface S3.

Further, in the semiconductor device according to another embodiment, a ratio of an area of the second upper surface S2 and an area of the first outer side surfaces P1 and P2 may be in a range of 1:0.0005 to 1:0.01. In addition, the contents of a first angle, a second angle, and heights and a difference d1, d2, and d3 may be equally applied.

In addition, the semiconductor device disclosed in FIG. 1A emits red light, but the semiconductor device according to another embodiment may emit green light and blue light.

FIGS. 10A to 10F are sequence diagrams illustrating a method of manufacturing the semiconductor device according to the embodiment.

Referring to FIG. 10A, ions may be implanted into a donor substrate S. The donor substrate S may include an ion layer I. Due to the ion layer I, the donor substrate S may include an intermediate layer 170 disposed at one side and a first layer 171 disposed at the other side. Although this is described below, the intermediate layer 170 may be a layer disposed on a coupling layer 130 of the semiconductor device in FIG. 12. Thus, the donor substrate S may include the intermediate layer 170 and the first layer 171.

The ions implanted into the donor substrate S may include hydrogen (H) ions, but the present invention is not limited to such a material. The ion layer I may be disposed to be spaced apart from one surface of the donor substrate S by a predetermined distance. The ion layer I may be spaced apart from one side surface of the donor substrate S by 2 μm or less. For example, the ion layer I may be formed to be spaced apart from one side surface of the donor substrate S by 2 μm. That is, the intermediate layer 170 may have a thickness of 2 μm. Preferably, the intermediate layer 170 may have a thickness of 0.4 μm to 0.6 μm.

Referring to FIG. 10B, a sacrificial layer 120 may be disposed between a substrate 110 and the coupling layer 130. In addition, a separation layer 180 may be disposed between the substrate 110 and the sacrificial layer 120.

The substrate 110 may be a transparent substrate including sapphire ($Al_2O_3$), glass, or the like. Thus, the substrate 110 may transmit laser light emitted from therebelow. As a result, during laser lift-off, the sacrificial layer 120 may absorb the laser light.

For example, the separation layer 180 may improve the reproduction of the substrate 110 which is, for example, a sapphire substrate. In addition, the separation layer 180 facilitates a transfer process by laser lift-off (LLO) to be described below with reference to FIGS. 11A to 11E. The separation layer 180 may be made of the same material as the coupling layer 130. For example, the separation layer 180 may include $SiO_2$. However, the sacrificial layer 120 may be disposed on the substrate 110 without interposing the separation layer 180 therebetween.

Accordingly, the substrate 110, the separation layer 180, the sacrificial layer 120, and the coupling layer 130 may be disposed by being stacked in this order. In addition, a coupling layer 130 disposed below the intermediate layer 170 disposed on one side surface of the donor substrate S may be disposed to be adjacent to and face the coupling layer 130 disposed on the sacrificial layer 120 so that the coupling layer 130 disposed below the intermediate layer 170 is disposed on the coupling layer 130 disposed on the sacrificial layer 120.

In addition, the coupling layer 130 may include $SiO_2$ as described above, and the coupling layer 130 disposed on the sacrificial layer 120 may be coupled to the coupling layer 130 disposed below the intermediate layer 170 by performing $O_2$ plasma treatment. However, the present invention is not limited thereto, and cutting may be performed by a material other than oxygen. For example, the coupling layer 130 disposed on the sacrificial layer 120 and the coupling layer 130 disposed below the intermediate layer 170 may have surfaces facing each other on which an etching process such as polishing or annealing is performed.

As a result, the separation layer 180 may be disposed on the substrate 110, the sacrificial layer 120 may be disposed on the separation layer 180, the coupling layer 130 may be disposed on the sacrificial layer 120, and the donor substrate S may be disposed above the coupling layer 130 to be spaced apart therefrom. In addition, in the donor substrate S, the coupling layer 130 may be disposed at a lowermost portion of the donor substrate S, the intermediate layer 170 may be disposed on the coupling layer 130, and the ion layer I and the first layer 171 may be sequentially disposed on the intermediate layer 170.

Referring to FIG. 10C, the intermediate layer 170 separated from the donor substrate may be disposed on the coupling layer 130. The ion layer I in FIG. 10B may be removed by fluid jet cleaving so that the first layer 171 may be separated from the intermediate layer 170.

Here, the first layer separated from the donor substrate may be reused as a substrate. For example, the separated first layer may be used as the donor substrate in FIGS. 10A to 10C. Accordingly, the separated first layer may be newly formed of a first layer, an ion layer, and an intermediate layer as a donor substrate. As a result, manufacturing and material cost reduction effects may be provided.

Accordingly, the intermediate layer 170 may be disposed on the coupling layer 130.

In addition, a semiconductor structure 140 may be disposed on the intermediate layer 170. The intermediate layer 170 may be in contact with the semiconductor structure 140. Since an upper surface of the intermediate layer 170 may have poor roughness due to voids generated by an ion implantation process and thus defects may be generated during epitaxial deposition, polishing may be performed on the upper surface of the intermediate layer 170 so that the upper surface of the intermediate layer 170 may be planarized. For example, chemical mechanical planarization may be performed on the upper surface of the intermediate layer 170, and the semiconductor structure 140 may be disposed on the upper surface of the intermediate layer 170 after the planarization. With such a configuration, electrical characteristics of the semiconductor structure 140 may be improved.

The semiconductor structure 140 may be disposed on the intermediate layer 170. The semiconductor structure 140 may include a first conductive semiconductor layer 141 disposed on the intermediate layer 170, a first clad layer 144 disposed on the first conductive semiconductor layer, an active layer 142 disposed on the first clad layer 144, and a second conductive semiconductor layer 143 disposed on the active layer 142. The semiconductor structure 140 may be applied with the same contents described with reference to FIG. 12.

Referring to FIG. 10D, first etching may be performed from an upper portion of the semiconductor structure 140 to a portion of the first conductive semiconductor layer 141.

The first etching may be wet-etching or dry-etching, but the present invention is not limited thereto and various methods may be applied for the first etching. Before the first etching is performed, a second electrode 152 of FIG. 10E may be disposed on the second conductive semiconductor layer 143 and then patterned as shown in FIG. 10E. However, the present invention is not limited to such a method.

Referring to FIG. 10E, the second electrode 152 may be disposed on the semiconductor structure 140. The second electrode 152 may be electrically connected to a second-second conductive semiconductor layer 143b. A lower surface of the second electrode 152 may have a smaller area than an upper surface of the second conductive semiconductor layer 143. For example, an edge of the second electrode 152 may be disposed to be spaced apart from an edge of the second conductive semiconductor layer 143 by 1 μm to 3 μm.

All electrode formation methods that are typically used, such as a sputtering method, a coating method, and a deposition method, may be applied to a first electrode 151 and the second electrode 152. However, the present invention is not limited thereto.

Further, as described above, the second electrode 152 may be formed before the first etching, and the first electrode 151 may be disposed on an upper surface of the first conductive semiconductor layer 41 etched and exposed after the first etching.

The first electrode 151 and the second electrode 152 may be disposed at different positions from the substrate 110. The first electrode 151 may be disposed on the first conductive semiconductor layer 141. The second electrode 152 may be disposed on the second conductive semiconductor layer 143. Thus, the second electrode 152 may be disposed further upward than the first electrode 151. However, the present invention is not limited thereto.

For example, when the first conductive semiconductor layer 141 is disposed on the second conductive semiconductor layer 143, the first electrode 151 may be disposed further upward than the second electrode 152.

The first electrode 151 may be disposed on the first conductive semiconductor layer 141 and electrically connected to the first conductive semiconductor layer 141. This may be applied with the same contents described with reference to FIG. 12.

Referring to FIG. 10F, second etching may be performed up to an upper surface of the substrate 110. The second etching may be wet-etching or dry-etching, but the present invention is not limited thereto. In the semiconductor device, the second etching may be performed to a thickness greater than that of the first etching.

Through the second etching, the semiconductor device disposed on the substrate may be isolated in the form of a plurality of chips. For example, referring to FIG. 10F, two semiconductor devices may be disposed on the substrate 110 through the second etching. The number of semiconductor devices may be variously set depending on the size of the substrate and the size of the semiconductor device.

In addition, an insulating layer 160 may be disposed to cover the sacrificial layer 120, the coupling layer 130, the intermediate layer 170, and the semiconductor structure 140. The insulating layer 160 may cover side surfaces of the sacrificial layer 120, the coupling layer 130, the intermediate layer 170, and the semiconductor structure 140. The insulating layer 160 may also cover a portion of an upper surface of the first electrode 151. In addition, a portion of the upper surface of the first electrode 151 may be exposed. The exposed portion of the upper surface of the first electrode 151 may be electrically connected to an electrode pad or the like so that current injection or the like may be performed. In addition, the insulating layer 160 may also cover a portion of an upper surface of the second electrode 152. A portion of the upper surface of the second electrode 152 may be exposed. Like the first electrode 151, the exposed portion of the upper surface of the second electrode 152 may be electrically connected to an electrode pad or the like so that current injection or the like may be performed. In addition, a portion of the insulating layer 160 may be disposed on the upper surface of the substrate. The insulating layer 160 disposed between adjacent semiconductor chips may be disposed in contact with the substrate 110.

FIGS. 11A to 11E are sequence diagrams illustrating a process of transferring the semiconductor device according to the embodiment to a display apparatus.

Referring to FIGS. 11A to 11E, a method of manufacturing a display apparatus according to one embodiment may include selectively emitting laser light to a semiconductor device including a plurality of semiconductor devices disposed on a substrate 110 to separate the semiconductor device from the substrate and placing the separated semiconductor device on a panel substrate. Here, as shown in FIGS. 10A to 10F, the semiconductor device before the transfer may include a separation layer disposed on the substrate 110, a sacrificial layer disposed on the separation layer, a coupling layer disposed on the sacrificial layer, a semiconductor structure disposed on the coupling layer, a first electrode, a second electrode, and an insulating layer. In addition, the semiconductor structure may include a first conductive semiconductor layer, a second conductive semiconductor layer, and an active layer disposed between the first conductive semiconductor layer and the second conductive semiconductor layer.

First, referring to FIG. 11A, the substrate 110 may be the same as the substrate 110 that has been described with reference to FIGS. 10A to 10F. In addition, as described above, the plurality of semiconductor devices may be disposed on the substrate 110. For example, the plurality of semiconductor devices may include a first semiconductor device 10-1, a second semiconductor device 10-2, a third semiconductor device 10-3, and a fourth semiconductor device 10-4. However, the present invention is not limited to such a number, and there may be a variety of numbers of semiconductor devices.

Referring to FIG. 11B, at least one semiconductor device selected from among the plurality of semiconductor devices 10-1, 10-2, 10-3, and 10-4 may be separated from a growth substrate using a transfer mechanism 210. The transfer mechanism 210 may include a first bonding layer 211 and a transfer frame 212 disposed therebelow. As an example, the transfer frame 212 may have an irregular structure and may easily bond the semiconductor devices to the first bonding layer 211.

Referring to FIG. 11C, when the transfer mechanism 210 is moved upward after the laser light emission, the first semiconductor device 10-1 and the third semiconductor device 10-3 may be separated from the transfer mechanism 210. In addition, a second bonding layer 310 may be bonded to the first semiconductor device 10-1 and the third semiconductor device 10-3.

Specifically, laser light is emitted to a lower portion of the selected semiconductor device to separate the selected semiconductor device from the substrate 110. At this time, the transfer mechanism 210 moves upward and the semiconductor device may also move along the movement of the transfer mechanism 210. For example, laser light is emitted to lower portions of regions of the substrate 110 on which the first semiconductor device 10-1 and the third semiconductor device 10-3 are disposed so that the first semiconductor device 10-1 and the third semiconductor device 10-3 may be separated from the substrate 110. In addition, in order to separate one semiconductor device at a time, the transfer mechanism 210 may be formed such that the bonding layer 211 is bonded to one semiconductor device.

For example, laser lift-off (LLO) using photon beams of a specific wavelength band may be applied as a method of separating the semiconductor device from the substrate 110. For example, the emitted laser light may have a center wavelength of 266 nm, 532 nm, or 1064 nm, but the present invention is not limited thereto.

In addition, a separation layer 180 and a coupling layer 130 disposed between the semiconductor device and the substrate 110 may prevent the semiconductor device from being physically damaged by the laser lift-off (LLO). The sacrificial layer may be separated from the semiconductor device by laser lift-off (LLO). For example, a portion of the sacrificial layer may be removed by the separation, and the remaining portion of the sacrificial layer may be separated along with the coupling layer. Thus, in the semiconductor device, the sacrificial layer and the coupling layer, the semiconductor structure, the first electrode, and the second electrode that are layers disposed above the sacrificial layer may be separated from the substrate 110. With such a configuration, the separation layer 180 may be left on the substrate 110. In addition, a portion of the sacrificial layer may be left on an upper surface of the separation layer, which is not illustrated in the following.

Further, the plurality of semiconductor devices separated from the substrate 110 may have a predetermined separation distance from each other. As described above, the first semiconductor device 10-1 and the third semiconductor device 10-3 may be separated from the growth substrate, and the second semiconductor device 10-2 and the fourth semiconductor device 10-4, which have the same separation distance as that between the first semiconductor device 10-1 and the third semiconductor device 10-3, may be separated from the growth substrate in the same manner. Thus, semiconductor devices separated by the same separation distance may be transferred to a display panel.

Referring to FIG. 11D, the selected semiconductor devices may be disposed on a panel substrate. For example, the first semiconductor device 10-1 and the third semiconductor device 10-3 may be disposed on a panel substrate 300. Specifically, the second bonding layer 310 may be disposed on the panel substrate 300, and the first semiconductor device 10-1 and the third semiconductor device 10-3 may be disposed on the second bonding layer 310. Thus, the first semiconductor device 10-1 and the third semiconductor device 10-3 may be bonded to the second bonding layer. With such a method, it is possible to improve efficiency of the transfer process by placing semiconductor devices having a separation distance on the panel substrate.

In addition, laser light may be emitted to separate selected semiconductor device from the first bonding layer 211. For example, laser light is emitted to an upper portion of the transfer mechanism 210 so that the first bonding layer 211 and the selected semiconductor device may be physically separated from each other.

Referring to FIG. 11E, when the transfer mechanism 210 is moved upward after the laser light emission, the first semiconductor device 10-1 and the third semiconductor device 10-3 may be separated from the transfer mechanism 210. In addition, the second bonding layer 310 may be bonded to the first semiconductor device 10-1 and the third semiconductor device 10-3.

FIG. 12 is a conceptual diagram of a display apparatus to which the semiconductor device according to the embodiment is transferred.

Referring to FIG. 12, the display apparatus including the semiconductor device according to the embodiment may include a second panel substrate 410, a driving thin-film transistor T2, a planarization layer 430, a common electrode CE, a pixel electrode AE, and the semiconductor device.

The driving thin-film transistor T2 includes a gate electrode GE, a semiconductor layer SCL, an ohmic contact layer OCL, a source electrode SE, and a drain electrode DE.

The driving thin-film transistor is a driving device and may be electrically connected to the semiconductor device to drive the semiconductor device.

The gate electrode GE may be formed along with a gate line. The gate electrode GE may be covered with a gate insulating layer 440.

The gate insulating layer 440 may be formed of a single layer or a plurality of layers which are made of an inorganic material and may be made of a silicon oxide ($SiO_x$), a silicon nitride ($SiN_x$), or the like.

The semiconductor layer SCL may be disposed on the gate insulating layer 440 in the form of a predetermined pattern (or island) so as to overlap the gate electrode GE. The semiconductor layer SCL may be made of a semiconductor material including one of amorphous silicon, polycrystalline silicon, an oxide, and an organic material, but the present invention is not limited thereto.

The ohmic contact layer OCL may be disposed on the semiconductor layer SCL in the form of a predetermined pattern (or island). The ohmic contact layer PCL may be for ohmic contact between the semiconductor layer SCL and the source and drain electrodes SE and DE.

The source electrode SE may be formed on the other side of the ohmic contact layer OCL so as to overlap one side of the semiconductor layer SCL.

The drain electrode DE may be formed on the other side of the ohmic contact layer OCL so as to be spaced apart from the source electrode SE while overlapping the other side of the semiconductor layer SCL. The drain electrode DE may be formed along with the source electrode SE.

A planarization film may be disposed on the entire surface of the second panel substrate 410. The driving thin-film transistor T2 may be disposed inside the planarization film. As one example, the planarization film may include an organic material such as benzocyclobutene or photoacryl, but the present invention is not limited thereto.

A groove 450 is a predetermined light-emitting region, and the semiconductor device may be disposed in the groove 450. Here, the light-emitting region may be defined as the remaining region excluding a circuit region in the display apparatus.

The groove 450 may be formed to be concave with respect to the planarization layer 430, but the present invention is not limited thereto.

The semiconductor device may be disposed in the groove 450. The semiconductor device may have a first electrode and a second electrode connected to a circuit (not shown) of the display apparatus.

The semiconductor device may be adhered to the groove 450 through an adhesive layer 420. Here, the adhesive layer 420 may be the second bonding layer, but the present invention is not limited thereto.

The second electrode 152 of the semiconductor device may be electrically connected to the source electrode SE of the driving thin-film transistor T2 through the pixel electrode AE. In addition, the first electrode 151 of the semiconductor device may be connected to a common power line CL through the common electrode CE.

The first and second electrodes 151 and 152 may be stepped from each other, and among the first and second electrodes 151 and 152, the electrode 151, which is placed at a relatively low position, may be positioned level with an upper surface of the planarization layer 430. However, the present invention is not limited thereto.

The pixel electrode AE may electrically connect the second electrode of the semiconductor device to the source electrode SE of the driving thin-film transistor T2.

The common electrode CE may electrically connect the first electrode of the semiconductor device to the common power line CL.

Each of the pixel electrode AE and the common electrode CE may include a transparent conductive material. The transparent conductive material may include a material such as indium tin oxide (ITO) or indium zinc oxide (IZO), but the present invention is not limited thereto.

The display apparatus according to the embodiment of the present invention may be implemented to have a standard definition (SD) resolution (760×480), a high definition (HD) resolution (1180×720), a full HD (FHD) resolution (1920×1080), and an ultra HD (UH) resolution (3480×2160) or a UHD or higher resolution (for example: 4K (K=1000), 8K, or the like). In this case, a plurality of such semiconductor devices according to the embodiment may be arranged and connected to each other depending on the resolution.

Further, the display apparatus may be an electric signboard or TV with a diagonal size of 100 inches or more, and pixels may be implemented as light-emitting diodes (LEDs). Accordingly, the display apparatus may have low power consumption, low maintenance cost, and a long lifespan and may be provided as a high-brightness self-luminous display.

According to the embodiment, videos and images are realized using the semiconductor device so that there is an advantage of excellent color purity and color reproduction.

According to the embodiment, videos and images are realized using a light-emitting device package of which optical straightness is high so that a 100 inch or larger display apparatus capable of providing clear pictures may be implemented.

According to the embodiment, a 100 inch or larger display apparatus with high definition may be implemented at a low cost.

The semiconductor device according to the embodiment may further include an optical member such as a light guide plate, a prism sheet, and a diffusion sheet and thus may function as a backlight unit. In addition, the semiconductor device according to the embodiment may also be applied to a display apparatus, a lighting apparatus, and an indicating apparatus.

Here, the display apparatus may include a bottom cover, a reflective plate, a light-emitting module, a light guide plate, an optical sheet, a display panel, an image signal output circuit, and a color filter. The bottom cover, the reflective plate, the light-emitting module, the light guide plate, and the optical sheet may constitute a backlight unit.

The reflective plate is placed on the bottom cover, and the light-emitting module emits light. The light guide plate is placed in front of the reflective plate to guide light, which is emitted by the light-emitting module, forward, and the optical sheet includes a prism sheet or the like and is placed in front of the light guide plate. The display panel is placed in front of the optical sheet, the image signal output circuit supplies an image signal to the display panel, and the color filter is placed in front of the display panel.

In addition, the lighting apparatus may include a light source module having the substrate and the semiconductor device of the embodiment, a heat dissipation part configured to dissipate heat of the light source module, and a power supply configured to process or convert an electrical signal provided from the outside to provide the electrical signal to the light source module. Furthermore, the lighting apparatus may include a lamp, a head lamp, a street lamp, or the like.

Further, a camera flash of a mobile terminal may include a light source module including the semiconductor device of the embodiment.

While the embodiments have been mainly described, they are only examples and do not limit the present invention, and it may be known to those skilled in the art that various modifications and applications, which have not been described above, may be made without departing from the essential properties of the embodiments. For example, the specific components described in the embodiments may be implemented while being modified. In addition, it will be interpreted that differences related to the modifications and applications fall within the scope of the present invention defined by the appended claims.

The invention claimed is:

1. A semiconductor device comprising:
    a semiconductor structure including a first conductive semiconductor layer, a second conductive semiconductor layer, and an active layer disposed between the first conductive semiconductor layer and the second conductive semiconductor layer;
    a first electrode electrically connected to the first conductive semiconductor layer; and
    a second electrode electrically connected to the second conductive semiconductor layer,
    wherein a ratio of an area of an upper surface of the second conductive semiconductor layer and an area of outer side surfaces of the active layer is in a range of 1:0.0005 to 1:0.01,
    wherein the semiconductor structure includes a first upper surface on which the first electrode is disposed, a second upper surface on which the second electrode is disposed, and an inclined surface disposed between the first upper surface and the second upper surface,
    wherein the active layer includes a first-first outer side surface which is exposed at the inclined surface, and a first-second outer side surface other than the first-first outer side surface, and
    wherein the inclined surface forms a first angle with respect to a virtual horizontal plane, a side surface of the semiconductor structure forms a second angle with respect to the horizontal plane, and the first angle is less than the second angle.

2. The semiconductor device of claim 1, wherein a ratio of a first minimum height from a bottom surface of the semiconductor structure to the second upper surface and a second minimum height from the bottom surface of the semiconductor structure to the first upper surface is in a range of 1:0.6 to 1:0.95.

3. The semiconductor device of claim 2, wherein a difference between the first minimum height and the second minimum height is less than 2 μm.

4. The semiconductor device of claim 1, wherein
the active layer includes a well layer and a barrier layer which are alternately disposed, and
the number of each of the well layer and the barrier layer is from 1 to 10.

5. The semiconductor device of claim 1, further comprising:
a coupling layer disposed below the semiconductor structure; and
a sacrificial layer disposed below the coupling layer.

6. The semiconductor device of claim 5, further comprising an intermediate layer disposed between the coupling layer and the semiconductor structure,
wherein the intermediate layer includes GaAs.

7. The semiconductor device of claim 1, wherein a minimum distance between the first-first outer side surface and the second upper surface is less than a minimum distance between the first-first outer side surface and the first upper surface.

8. The semiconductor device of claim 1, wherein
the first angle is in a range of 60° to 80°,
the second angle is in a range of 70° to 90°, and
wherein the first angle is different than the second angle.

* * * * *